(12) United States Patent
Korekado et al.

(10) Patent No.: US 8,872,089 B2
(45) Date of Patent: Oct. 28, 2014

(54) SOLID-STATE IMAGING DEVICE

(75) Inventors: Keisuke Korekado, Wako (JP);
Tomoyuki Kamiyama, Wako (JP);
Yoichi Nishimura, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 250 days.

(21) Appl. No.: 13/638,258

(22) PCT Filed: Mar. 29, 2011

(86) PCT No.: PCT/JP2011/057748
§ 371 (c)(1),
(2), (4) Date: Sep. 28, 2012

(87) PCT Pub. No.: WO2011/122600
PCT Pub. Date: Oct. 6, 2011

(65) Prior Publication Data
US 2013/0020471 A1    Jan. 24, 2013

(30) Foreign Application Priority Data

Mar. 31, 2010   (JP) ................................ 2010-084600

(51) Int. Cl.
| H01L 27/146 | (2006.01) |
| H04N 5/378 | (2011.01) |
| H04N 5/335 | (2011.01) |
| H04N 5/361 | (2011.01) |
| H03M 1/12 | (2006.01) |
| H03M 1/56 | (2006.01) |

(52) U.S. Cl.
CPC ............... *H04N 5/378* (2013.01); *H04N 5/335* (2013.01); *H04N 5/361* (2013.01); *H03M 1/56* (2013.01); *H03M 1/123* (2013.01)
USPC .......................... 250/208.1; 341/155; 341/126

(58) Field of Classification Search
USPC .............................. 250/208.1; 341/150–170
See application file for complete search history.

(56) References Cited

U.S. PATENT DOCUMENTS

| 5,432,830 A | 7/1995 | Bonnot |
| 5,990,948 A | 11/1999 | Sugiki |

(Continued)

FOREIGN PATENT DOCUMENTS

| JP | 6-216762 A | 8/1994 |
| JP | 08-122149 A | 5/1996 |

(Continued)

OTHER PUBLICATIONS

Japanese Office Action application No. JP 2010-084600 dated Dec. 3, 2013.

(Continued)

*Primary Examiner* — Tony Ko
(74) *Attorney, Agent, or Firm* — Squire Patton Boggs (US) LLP

(57) ABSTRACT

Disclosed is a solid-state imaging device capable of calculating the difference in charge obtained by photoelectric conversion, and capable of a high level of integration. A solid-state imaging device is provided with an AD converter which is provided with: a first comparator which outputs a signal corresponding to a first analog signal of a first pixel by comparing said first analog signal with a reference voltage supplied from the reference voltage generation unit which generates a reference voltage which gradually changes; a second comparator which outputs a signal corresponding to a second analog signal of a second pixel by comparing said second analog signal with the reference voltage supplied by the reference voltage generation unit; a difference circuit which finds the difference between the signal corresponding to said first analog signal and the signal corresponding to said second analog signal and outputs a difference signal; and a counter circuit which counts the number of pulses in a pulse sequence corresponding to the aforementioned difference signal and converts said difference signal into a digital signal.

12 Claims, 33 Drawing Sheets

(56) References Cited

U.S. PATENT DOCUMENTS

| | | | |
|---|---|---|---|
| 7,538,709 B2 * | 5/2009 | Muramatsu et al. | 341/161 |
| 7,629,914 B2 | 12/2009 | Muramatsu et al. | |
| 8,253,809 B2 * | 8/2012 | Nishi | 348/207.99 |
| 8,730,363 B2 * | 5/2014 | Nishi | 348/294 |
| 2011/0090385 A1 | 4/2011 | Aoyama et al. | |

FOREIGN PATENT DOCUMENTS

| | | |
|---|---|---|
| JP | 9-238286 A | 9/1997 |
| JP | 2004-294420 A | 10/2004 |
| JP | 2005-311933 A | 11/2005 |
| JP | 2006-084429 A | 3/2006 |
| JP | 2008-089346 A | 4/2008 |
| JP | 2008-278477 A | 11/2008 |
| JP | 2009-159331 A | 7/2009 |
| JP | 2010-16656 A | 1/2010 |
| WO | 2009/147862 A1 | 12/2009 |

OTHER PUBLICATIONS

International Search Report and Written Opinion dated May 10, 2011 corresponding to International Patent Application No. PCT/JP2011/057748.

* cited by examiner

FIG. 21

TRUTH TABLE

| COMPARISON RESULT SIGNAL | | JUDGMENT SIGNAL | |
|---|---|---|---|
| A | B | $\alpha$ | $\beta$ |
| L | L | H | L |
| H | L | L | L |
| L | H | L | H |
| H | H | H | H |

SOLID-STATE IMAGING DEVICE

TECHNICAL FIELD

The present invention relates to a solid-state image sensing device (solid-state imaging device) that functions as a distance measuring sensor.

BACKGROUND ART

Heretofore, in the field of CMOS image sensors, there has been known a column ADC technology for obtaining AD conversion results, which are resistant to exogenous noise.

Japanese Laid-Open Patent Publication No. 09-238286 discloses that an amplifying solid-state image sensing device, which incorporates a plurality of analog-to-digital converters with a noise reducing function (integrating analog-to-digital converters) therein, latches and then successively selects digital signals from the analog-to-digital converters.

Heretofore, there has also been known a TOF (Time Of Flight) method for measuring the distance up to a subject by detecting light reflected from a subject that is illuminated by an illuminating unit. Since pixels, which detect the reflected light, also receive ambient light such as sunlight in addition to reflected light, it is necessary to subtract the amount of photoelectrons, which are generated by the pixels as a result of ambient light, from the amount of photoelectrons that are generated by the pixels due to both reflected light and ambient light.

Japanese Laid-Open Patent Publication No. 2008-089346 discloses a solid-state image sensing device for generating the difference between a plurality of stored photoelectrons. More specifically, the disclosed solid-state image sensing device includes a plurality of capacitors and a plurality of photoelectron storage units for storing photoelectrons generated from light detected by pixels. The photoelectron storage units and the capacitors are selectively rendered electrically conductive so as to cause the capacitors to store photoelectrons representing the difference between the photoelectrons stored in the photoelectron storage units. Thus, the solid-state image sensing device can extract from the capacitors differential components of the photoelectrons stored in the photoelectron storage units.

SUMMARY OF INVENTION

According to the column ADC process of the background art, the full amount of all of the photoelectrons produced from the pixel area is converted into an output digital signal. A distance measuring sensor, which requires the removal of ambient light, is not efficient, in that the distance measuring sensor has to convert the full amount of all of the photoelectrons into a digital signal in order to perform a subsequent subtracting process.

Employing the technology disclosed in Japanese Laid-Open Patent Publication No. 2008-089346, it is difficult to highly integrate pixels, i.e., to achieve higher resolution, because the pixels are combined together with a plurality of switches and capacitors for storing differential photoelectrons. Further, adverse effect of thermal noise (kTC noise) due to switching may be caused The present invention has been made in view of the above problems. It is an object of the present invention to provide a highly integratable solid-state image sensing device, which is capable of calculating a difference between photoelectrons generated by a photoelectric conversion.

To achieve the above object, in accordance with the present invention, there is provided a solid-state image sensing device comprising a first photoelectron storage unit for storing a photoelectron that is generated by photoelectric conversion during a first exposure period in which only ambient light is detected for a predetermined time while a subject is not illuminated with an emitted light by an illuminating unit for illuminating the subject for measuring a distance to the subject, a second photoelectron storage unit for storing a photoelectron that is generated by photoelectric conversion during a second exposure period for the predetermined time, including a period during which the emitted light reflected from the subject and the ambient light are detected, and an AD converter for converting an analog signal into a digital signal. The AD converter includes a first comparator for comparing a reference voltage supplied from a reference voltage generator for generating the reference voltage, the level of which gradually varies, and a first analog signal from the first photoelectron storage unit with each other, and outputting a signal depending on the first analog signal, a second comparator for comparing the reference voltage supplied from the reference voltage generator and a second analog signal from the second photoelectron storage unit with each other, and outputting a signal depending on the second analog signal, a differential circuit for determining a difference between the signal depending on the first analog signal and the signal depending on the second analog signal, and outputting a differential signal representing the difference, and a first counter circuit for counting pulses of a pulse train depending on the differential signal, and converting the differential signal into a digital signal.

The differential circuit may comprise an exclusive-OR circuit or a phase difference detector.

The first analog signal and the second analog signal may comprise an analog signal of a black level and an analog signal of a signal level. The first counter circuit may comprise a plurality of flip-flop circuits for counting the pulses of the pulse train depending on the signal output from the differential circuit, a plurality of switch circuits connected to respective previous stages of the flip-flop circuits, for selecting a propagated signal, or a low-level signal, or a high-level signal, which is input thereto, and outputting the selected signal as an output signal to each clock terminal of the following flip-flop circuits, a control signal generating circuit for generating a switch circuit control signal for controlling the switch circuits to select the propagated signal, or the low-level signal, or the high-level signal, and a pulse generating circuit for generating one pulse for converting a count value into a 2's complement. The pulse train depending on the signal output from the differential circuit may be supplied to a head one of the switch circuits as the propagated signal, and inverted output signals from the previous flip-flop circuits may be supplied to switch circuits other than the head switch circuit, as the propagated signal. The control signal generating circuit may control the switch circuits to output the propagated signal during a first AD conversion period in which the differential signal of the black level is converted into a digital signal, and during a second AD conversion period in which the differential signal of the signal level is converted into a digital signal, for thereby causing the flip-flop circuits to count up the pulses of the pulse train depending on the differential signal. The control signal generating circuit may control the switch circuits to output the low-level signal and the high-level signal during a period in which the first AD conversion period is transferred to the second AD conversion period, for thereby converting the count value produced during the first AD conversion period into a 1's complement. The pulse generating circuit may input the generated one pulse to the head one of the switch circuits after the count value has been converted into the 1's complement and before the second AD conversion period, for thereby converting the count value produced during the first AD conversion period into the 2's complement.

The first comparator may compare the reference voltage and the first analog signal from the first photoelectron storage unit with each other, and invert a signal output therefrom based on a comparison result thereof. The second comparator may compare the reference voltage and the second analog signal from the second photoelectron storage unit with each other, and invert a signal output therefrom based on a comparison result thereof. The second comparator may invert the signal output therefrom at a timing, which is later than a timing at which the first comparator inverts the signal output therefrom.

The reference voltage may have a first reference level for auto-zeroing the first comparator, and a second reference level for auto-zeroing the second comparator, the second reference level being different from the first reference level. The first comparator may be auto-zeroed such that a level produced by subtracting a first offset voltage from the first reference level and a level produced by subtracting a second offset voltage from an analog signal of a black level of the first analog signal are of the same potential. The second comparator may be auto-zeroed such that a level produced by subtracting a third offset voltage from the second reference level and a level produced by subtracting a fourth offset voltage from an analog signal of a black level of the second analog signal are of the same potential.

The first analog signal and the second analog signal may comprise an analog signal of a black level and an analog signal of a signal level. The first counter circuit may comprise a plurality of flip-flop circuits for counting the pulses of the pulse train depending on the signal output from the differential circuit, a plurality of switch circuits connected to respective previous stages of the flip-flop circuits, for selecting a propagated signal, or a low-level signal, or a high-level signal which is input thereto, and outputting the selected signal as an output signal to each clock terminal of the following flip-flop circuits, a control signal generating circuit for generating a switch circuit control signal for controlling the switch circuits to select the propagated signal, or the low-level signal, or the high-level signal, and a pulse generating circuit for generating one pulse for converting a count value into a 2's complement. The pulse train depending on the signal output from the differential circuit may be supplied to a head one of the switch circuits as the propagated signal, and inverted output signals from the previous flip-flop circuits may be supplied to switch circuits other than the head switch circuit, as the propagated signal. The AD converter may comprise a third comparator for comparing the first analog signal and the second analog signal with each other, a judging circuit for judging, based on a comparison result of the third comparator, whether or not the count value is to be converted into the 2's complement during a first complement conversion period transferring from a first AD conversion period, in which the differential signal of the black level is converted into a digital signal, to a second AD conversion period, in which the differential signal of the signal level is converted into a digital signal, and during a second complement conversion period after the second AD conversion period has finished, and a complement control circuit for controlling the control signal generating circuit and the pulse generating circuit so as to control execution or non-execution of the process of converting the count value into the 2's complement, based on a judgment result of the judging circuit. The complement control circuit may cause the control signal generating circuit to control the switch circuits to output the propagated signal, for thereby causing the flip-flop circuits to count up the pulses of the pulse train depending on the differential signal. The complement control circuit may also cause the control signal generating circuit to control the switch circuits to output the low-level signal and the high-level signal during the complement conversion period in which it is judged that the count value is to be converted into the 2's complement, for thereby converting the count value into a 1's complement, and to control the switch circuits to output the propagated signal and control the pulse generating circuit in order to generate and input the one pulse to the head one of the switch circuits after the count value has been converted into the 1's complement.

The judging circuit may judge that the count value is to be converted into the 2's complement during the first complement conversion period and that the count value is not to be converted into the 2's complement during the second complement conversion period, if the first analog signal of the black level is greater than the second analog signal of the black level and the first analog signal of the signal level is greater than the second analog signal of the signal level. The judging circuit may also judge that the count value is not to be converted into the 2's complement during the first complement conversion period and the second complement conversion period, if the first analog signal of the black level is smaller than the second analog signal of the black level and the first analog signal of the signal level is greater than the second analog signal of the signal level. The judging circuit may further judge that the count value is to be converted into the 2's complement during the second complement conversion period, and that the count value is not to be converted into the 2's complement during the first complement conversion period, if the first analog signal of the black level is greater than the second analog signal of the black level and the first analog signal of the signal level is smaller than the second analog signal of the signal level. The judging circuit may further judge that the count value is to be converted into the 2's complement during the first complement conversion period and the second complement conversion period, if the first analog signal of the black level is smaller than the second analog signal of the black level and the first analog signal of the signal level is smaller than the second analog signal of the signal level.

Each of the switch circuits may include a first transfer gate and a second transfer gate, the switch circuit control signal may include a first control signal, which is input to the first transfer gate, for converting the count value into the 1's complement, and a second control signal for turning on and off the first transfer gate and the second transfer gate, and the propagated signal may be input to the second transfer gate.

The first photoelectron storage unit and the second photoelectron storage unit may be disposed in different unit pixels.

The first photoelectron storage unit and the second photoelectron storage unit may be disposed in one unit pixel.

The AD converter may further include a second counter circuit for counting pulses of a pulse train depending on the signal output from the first comparator and converting the signal into a digital signal.

According to the present invention, an analog signal, which is representative of energy of light incident on a pixel during the first exposure period, is subtracted from an analog signal, which is representative of energy of light incident on the pixel during the second exposure period. Therefore, a digital value can be produced, which represents the analog signal representative of the energy of light incident on the pixel during the second exposure period minus (−) the analog signal representative of the energy of light incident on the pixel during the first exposure period. In other words, inasmuch as differences between the amounts of photoelectrons in different photoelectron storage units can be calculated upon AD conversion thereof, the number of counter circuits can be reduced, the amount of consumed electric power can be reduced, and noise can be reduced.

Since the second comparator inverts the signal at a timing later than the timing at which the signal output from the first comparator is inverted, a differential signal can reliably be calculated, which represents the analog signal representative of the energy of light incident on the pixel during the second exposure period minus (−) the analog signal representative of the energy of light incident on the pixel during the first exposure period. Thus, a digital value representing the differential signal an be produced.

Since the count value produced by the flip-flop circuits is converted into a 1's complement and a 2's complement, the counter circuit, which functions only for counting up pulses, can function as a counter circuit both for counting up and counting down pulses. Since the counter circuit only counts up pulses, the circuit operation thereof is simple, making the switch circuits simple in configuration and reducing the installation area for the counter circuit. Since the count value is expressed as a 2's complement, the count value can easily be handled by digital logic circuits, and addition of a plurality of pixel values using a counter can be coped with.

The first analog signal and the second analog signal are compared with each other, it is judged whether or not the count value is to be converted into a 2's complement during the first complement conversion period and the second complement conversion period based on a comparison result, and execution or non-execution of the 2's complement conversion is controlled based on the judgment result. Therefore, even if the black level second analog signal is higher in level than the black level first analog signal, and even if the signal level of the second analog signal is higher in level than the black level first analog signal, a differential signal an reliably be calculated, which represents the analog signal representative of the energy of light incident on the pixel during the second exposure period minus (−) the analog signal representative of the energy of light incident on the pixel during the first exposure period. Therefore, a digital value representing the differential signal an be produced.

BRIEF DESCRIPTION OF DRAWINGS

FIG. 21 is a diagram showing a truth table containing respective comparison result signals and judgment signals;

DESCRIPTION OF EMBODIMENTS

Figure 1:
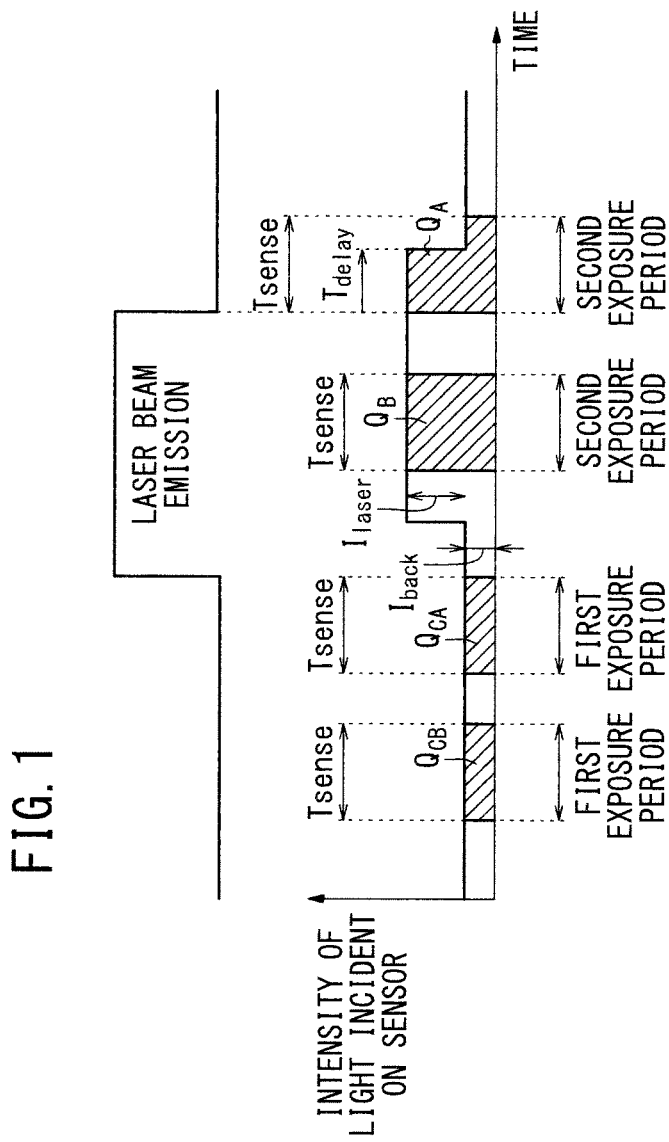
FIG. 1 is a diagram illustrating the principles of TOF.

Solid-state image sensing devices according to preferred embodiments of the present invention will be described in detail below with reference to the accompanying drawings.

Prior to describing the solid-state image sensing devices according to the embodiments, the principles of TOF (time of flight) will briefly be described below with reference to FIG. 1. During a first exposure period, an illuminating unit (not shown) for illuminating a subject with an emitted light (e.g., a laser light) does not illuminate the subject with the emitted light, but rather, only ambient light is detected for a predetermined time $T_{sense}$. During the first exposure period, a light detector included in a pixel (not shown) generates photoelectrons (electric charges) by photoelectric conversion in response to the incident light, and a photoelectron storage unit included in the pixel takes in the electrons generated during the first exposure period. There are two first exposure periods during which the pixel generates electrons by photoelectric conversion in response to an incident light and introduces the generated electrons into the photoelectron storage unit. The energy of light incident on the pixel in the first exposure period during the first occurrence thereof is indicated by $Q_{CB}$, whereas the energy of light incident on the pixel in the first exposure period during the second occurrence thereof is indicated by $Q_{CA}$.

During a second exposure period, a light reflected from the subject when the subject is illuminated with the light emitted from the illuminating unit is detected by the light detector. During the second exposure period, the light detector generates photoelectrons (electric charges) by photoelectric conversion in response to the incident light, and the photoelectron storage unit takes in the electrons generated during the second exposure period. The pixel generates electrons by photoelectric conversion by light in the second exposure period, during the first occurrence in which the illuminating unit illuminates the subject with the light emitted thereby, and the pixel detects both ambient light and the reflected emitted light from the subject illuminated with the emitted light for a certain period ($T_{sense}$). Thereafter, the pixel performs photoelectric conversion by light in the second exposure period during the second occurrence in which the pixel detects light for a certain period ($T_{sense}$) after the illuminating unit has illuminated the subject with the light emitted thereby. The energy of light incident on the pixel during the second exposure period in the first occurrence is indicated by $Q_B$, whereas the energy of light incident on the pixel during the second exposure period in the second occurrence is indicated by $Q_A$. In FIG. 1, $I_{laser}$ represents the intensity of the reflected emitted light from the subject illuminated with the emitted light, and $I_{back}$ represents the intensity of the ambient light.

Therefore, the equations $Q_A - Q_{CA} = I_{laser} \times T_{delay}$, $Q_B - Q_{CB} = I_{laser} \times T_{sense}$ are satisfied, where $T_{delay}$ represents the time consumed until the emitted light is reflected back from the subject.

The equation $T_{delay} = T_{sense} \times (Q_A - Q_{CA})/(Q_B - Q_{CB})$ can be derived from the above equations. The distance Z to the subject is expressed by $Z = c \times T_{delay}/2 = c \times T_{sense} \times (Q_A - Q_{CA})/2(Q_B - Q_{CB})$, where c represents the speed of light. In order to determine the distance to the subject, it is necessary for the ambient light to be removed, and information is required, which is representative of $Q_A - Q_{CA}$ and $Q_B - Q_{CB}$.

Figure 2:
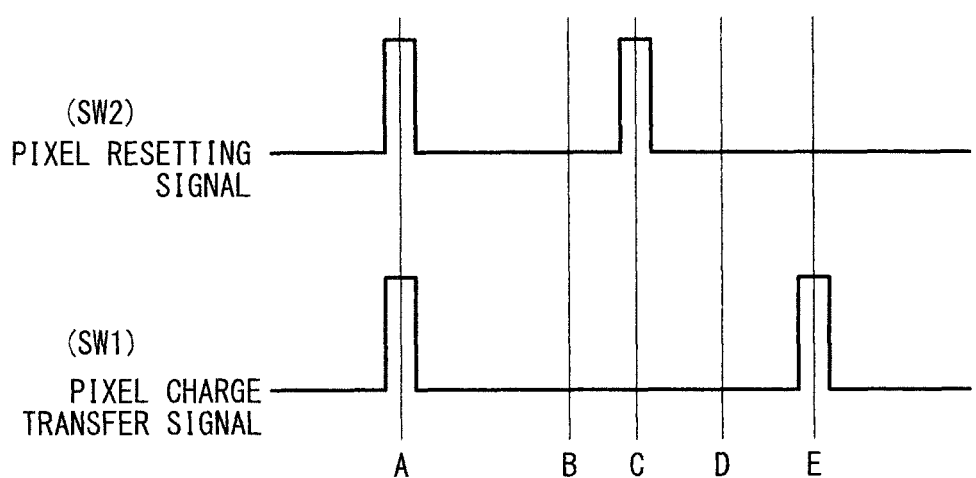
FIG. 2 is a timing chart of signals that are sent to a switching element of a pixel.

Basic operations of a general pixel will briefly be described below. FIG. 2 is a timing chart of signals that are sent to a switching element of a given pixel, and FIGS. 3 through 7 are circuit status diagrams and potential diagrams of a pixel at timings A through E, as shown in the timing chart of FIG. 2.

A pixel 10 includes a photodetector 12, a first switching element SW1, an FD (Floating Diffusion) 14, a second switching element SW2, a photoelectron discharger 16, and a pixel amplifier 18.

The photodetector 12, which generates photoelectrons by light, is connected to the FD (photoelectron holder) 14 by the first switching element SW1. The first switching element SW1 comprises an n-channel MOS transistor, for example. The first switching element SW1 can selectively be turned on and off by a pixel charge transfer signal supplied thereto. When the first switching element SW1 is turned on, a photoelectron stored in the photodetector 12 is transferred to the FD 14.

The FD 14 and the photoelectron discharger 16 are connected to each other through the second switching element SW2. The photoelectron discharger 16 is supplied with a positive power supply voltage VDD from a non-illustrated power supply. The second switching element SW2 comprises an n-channel MOS transistor, for example. The second switching element SW2 can selectively be turned on and off by a pixel-resetting signal supplied thereto. When the second switching element SW2 is turned on, a photoelectron, which is present in the FD 14, is discharged through the photoelectron discharger 16.

When the first switching element SW1 and the second switching element SW2 are turned on, photoelectrons, which are present in the photodetector 12 and the FD 14, are respectively discharged (drained), thereby resetting the pixel 10. The first switching element SW1, the second switching element SW2, and the photoelectron discharger 16 function jointly as a resetting section.

The pixel amplifier 18 is connected to a vertical signal line 20. A signal analog signal) representative of the voltage of the FD 14 is read from the vertical signal line 20 through the pixel amplifier 18.

Figure 3:
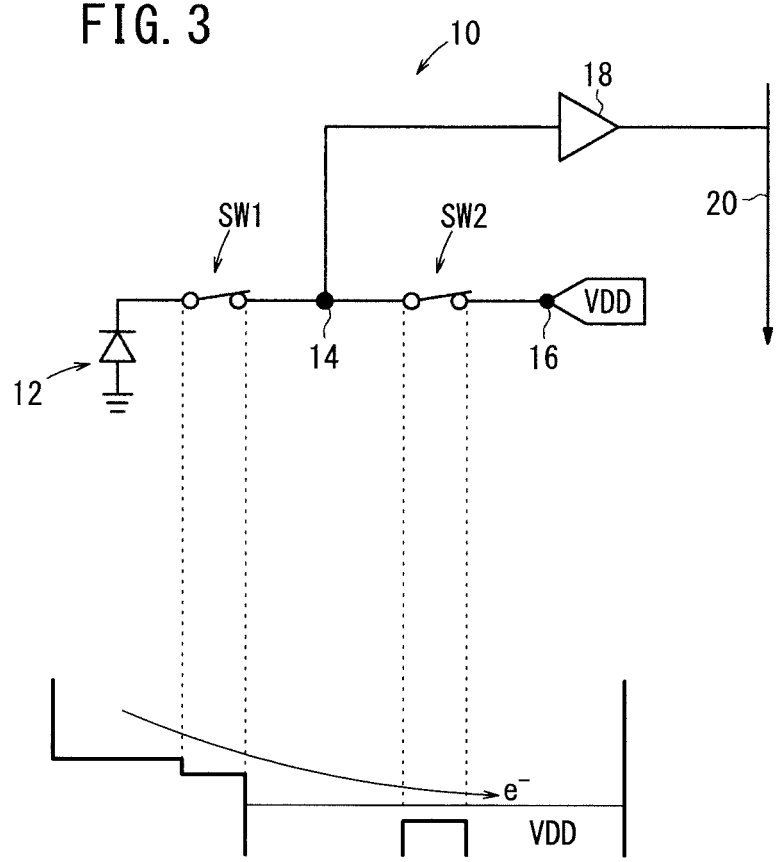
FIG. 3 is a circuit status diagram and a potential diagram of a pixel at a pixel-resetting timing A shown in FIG. 2.

FIG. 3 is a circuit status diagram and a potential diagram of the pixel 10, at a pixel resetting timing A shown in FIG. 2. At the pixel-resetting timing A, a pixel resetting signal, which is of a high level (1), is supplied to the second switching element SW2, and a pixel charge transfer signal, which is of a high level (1), is supplied to the first switching element SW1. Therefore, the first switching element SW1 and the second switching element SW2 are turned on. As can be seen from the potential diagram, which is shown beneath the circuit status diagram, the photoelectron stored in the photodetector 12 and the photoelectron present in the FD 14 are discharged respectively from the photoelectron discharger 16, whereupon the pixel 10 is reset.

Figure 4:
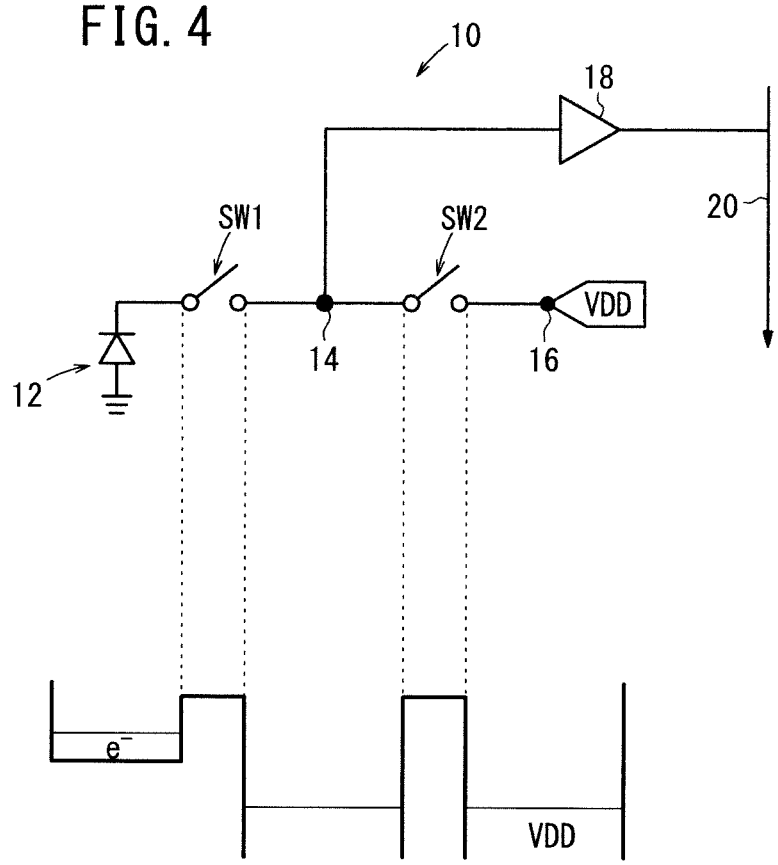
FIG. 4 is a circuit status diagram and a potential diagram of the pixel at an exposure timing B shown in FIG. 2.

FIG. 4 is a circuit status diagram and a potential diagram of the pixel 10 at a timing B shown in FIG. 2. At timing B, the first switching element SW1 and the second switching element SW2 are not supplied with a high level signal, but rather, are supplied with a low level signal, which is of a low level (0). Therefore, both the first switching element SW1 and the second switching element SW2 are turned off. As can be seen from the potential diagram, which is shown beneath the circuit status diagram, a potential barrier is formed between the photodetector 12 and the FD 14, as well as between the FD 14 and the photoelectron discharger 16. The potential barrier between the photodetector 12 and the FD 14 ensures that the photoelectron generated by photoelectric conversion is stored in the photodetector 12.

Figure 5:
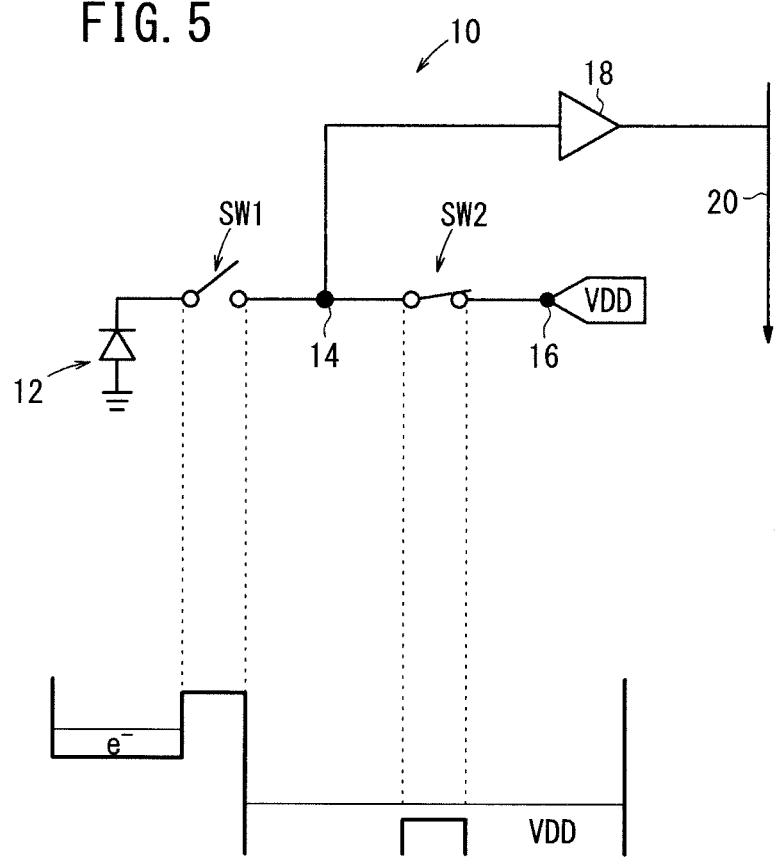
FIG. 5 is a circuit status diagram and a potential diagram of the pixel at an FD resetting timing C shown in FIG. 2.

FIG. 5 is a circuit status diagram and a potential diagram of the pixel 10 at an FD resetting timing C, as shown in FIG. 2. At timing C, the first switching element SW1 is supplied with a pixel charge transfer signal, which is of a low level, and the second switching element SW2 is supplied with a pixel resetting signal, which is of a high level. Therefore, the first switching element SW1 is turned off, whereas the second switching element SW2 is turned on. As can be seen from the potential diagram, the photoelectron, which is present in the FD 14, is discharged from the photoelectron discharger 16. The photoelectron present in the FD 14 is discharged due to the fact that, since the photoelectron stored in the photodetector 12 is intended to be transferred to the FD 14, the photoelectron present in the FD 14 must be reset before the photoelectron stored in the photodetector 12 is transferred to the FD 14. A black level voltage signal refers to a voltage signal of a pixel that has been reset, or more specifically, a signal representing the voltage of the FD 14, which has been reset.

Figure 6:
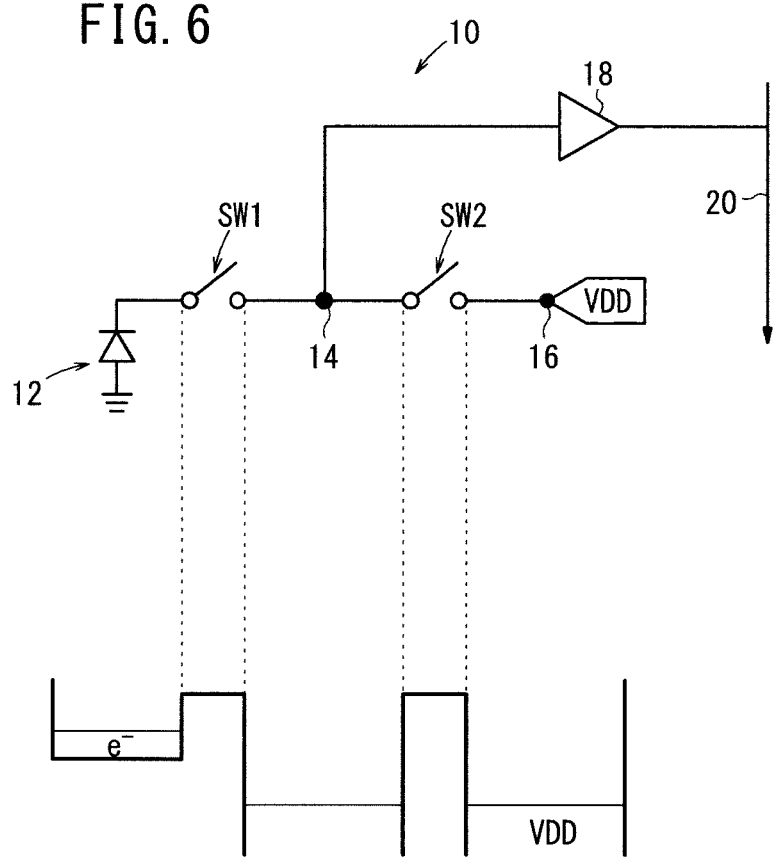
FIG. 6 is a circuit status diagram and a potential diagram of the pixel at a black level reading period timing D shown in FIG. 2.

FIG. 6 is a circuit status diagram and a potential diagram of the pixel 10 at a black level reading period timing D, as shown in FIG. 2. At timing D, both the first switching element SW1 and the second switching element SW2 are supplied with a signal, which is of a low level. Therefore, both the first switching element SW1 and the second switching element SW2 are turned off. As can be seen from the potential diagram, a potential barrier is formed between the photodetector 12 and the FD 14, as well as between the FD 14 and the photoelectron discharger 16. At timing D, an analog signal (e.g., a voltage signal) of the FD 14, i.e., an analog signal of a black level, is read through the vertical signal line 20.

Figure 7:
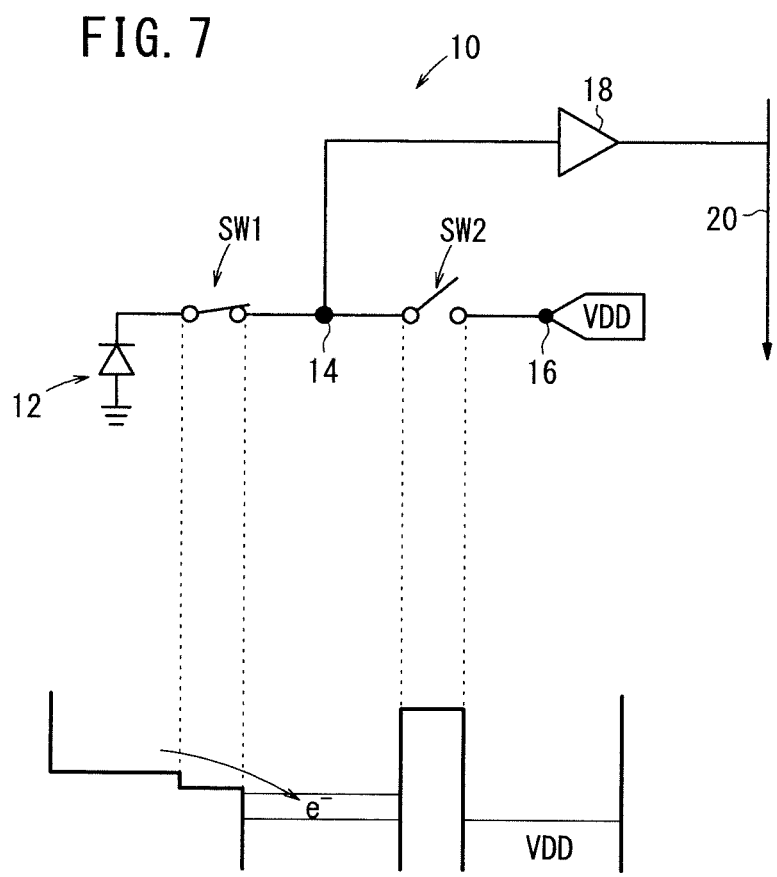
FIG. 7 is a circuit status diagram and a potential diagram of the pixel at a pixel reading period timing E shown in FIG. 2.

FIG. 7 is a circuit status diagram and a potential diagram of the pixel 10 at a pixel reading period timing E, as shown in FIG. 2. At timing E, the first switching element SW1 is supplied with a pixel charge transfer signal, which is of a high level, and the second switching element SW2 is supplied with a pixel resetting signal, which is of a low level. Therefore, the first switching element SW1 is turned on, whereas the second switching element SW2 is turned off. As can be seen from the potential diagram, the photoelectron stored in the photodetector 12 is transferred to the FD 14.

Thereafter, the first switching element SW1 is turned off, and an analog signal (e.g., a voltage signal) of the FD 14, i.e., an analog signal of the pixel, which is generated by photoelectric conversion (an analog signal of a signal level), is read through the vertical signal line 20.

Basic operations of a general pixel have been described above. According to the present invention, the pixel may include a photoelectron storage unit. If a photoelectron storage unit is included in the pixel, then the photoelectron, which is generated by photoelectric conversion with the photodetector 12, is stored in the photoelectron storage unit, and thereafter, an analog signal representative of the photoelectron, which is transferred to and stored in the FD 14, is read through the vertical signal line 20.

A solid-state image sensing device 30 according to an embodiment of the present invention will be described below with reference to FIG. 8. The solid-state image sensing device 30 comprises a pixel array 32 including a matrix of unit pixels (hereinafter referred to as pixels) 10, a V driver 34 for energizing the pixels 10 of the pixel array 32, a plurality of vertical signal lines 38, 40, 42, for outputting analog signals $VQ_A$, $VQ_{CA}$, $VQ_B$, $VQ_{CB}$ from the photoelectron storage units (FDs 14) of the pixels 10 to a plurality of AD converters 36, a horizontal transfer line 48 connected through respective switches 46 to the AD converters 36, and an output circuit 50 connected to one end of the horizontal transfer line 48.

Each of the AD converters 36 includes a first comparator 60, a second comparator 62, a differential circuit 64, an AND circuit 66, and a counter circuit (first counter circuit) 68. The solid-state image sensing device 30 includes a reference voltage generator 52 for generating a reference voltage (Vref) the level of which varies gradually. The reference voltage generator 52 outputs the generated reference voltage to the positive terminals of the first and second comparators 60, 62. The reference voltage is a voltage in the form of a sawtooth (ramp) waveform that varies stepwise with time.

In the first exposure period, during which the illuminating unit does not illuminate the subject with the emitted light, but rather, only ambient light is detected for a predetermined time, analog signals (first analog signals) $VQ_{CA}$, $VQ_{CB}$, which are generated by first pixels 10a, 10b, are input through the vertical signal lines 40, 44 to respective negative terminals of the first comparators 60 of the AD converters 36. The first pixels 10a, 10b output electrons generated by photoelectric conversion during the first exposure period.

In the second exposure period, which includes a period during which both ambient light and light, which is reflected from the subject when the subject is illuminated with the light emitted by the illuminating unit, are detected, analog signals (second analog signals) $VQ_A$, $VQ_B$ generated by second pixels 10c, 10d are input through the vertical signal lines 38, 42 to respective negative terminals of the second comparators 62 of the AD converters 36. The second pixels 10c, 10d output electrons generated by photoelectric conversion during the second exposure period.

The second pixel 10c, which is connected to the vertical signal line 38, outputs electrons generated by photoelectric conversion during the second exposure period, immediately after the illuminating unit has stopped illuminating the subject. The second analog signal $VQ_A$, which is generated by the second pixel 10c during the second exposure period, is input through the vertical signal line 38 to the negative terminal of the second comparator 62 of one of the AD converters 36 to which the first analog signal $VQ_{CA}$ is supplied.

The second pixel 10d, which is connected to the vertical signal line 42, outputs electrons generated by photoelectric conversion during the second exposure period while the illuminating unit illuminates the subject. The second analog signal $VQ_B$, which is generated by the second pixel 10d during the second exposure period, is input through the vertical signal line 42 to the negative terminal of the second comparator 62 of one of the AD converters 36 to which the first analog signal $VQ_{CB}$ is supplied.

Each of the first comparators 60 compares the reference voltage with the first analog signal $VQ_{CA}$ from the first pixel 10a, or the first analog signal $VQ_{CB}$ from the first pixel 10b, and outputs a signal that is switched to either 1 or 0 depending on the first analog signal $VQ_{CA}$ or the first analog signal $VQ_{CB}$.

Each of the second comparators 62 compares the reference voltage with the second analog signal $VQ_A$ from the second pixel 10c, or the second analog signal $VQ_B$ from the second pixel 10d, and outputs a signal that is switched to either 1 or 0 depending on the second analog signal $VQ_A$ or the second analog signal $VQ_B$.

The differential circuit 64, which comprises an exclusive-OR circuit (EXOR circuit), calculates the difference between a signal, which depends on the first analog signal $VQ_{CA}$ or the first analog signal $VQ_{CB}$ from the first comparator 60, and a signal, which depends on the second analog signal $VQ_A$ or the second analog signal $VQ_B$ from the second comparator 62, and the differential circuit 64 outputs a differential signal that represents the calculated difference. Accordingly, the differential circuit 64 outputs a differential signal between the first analog signal $VQ_{CA}$ and the second analog signal $VQ_A$, or a differential signal between the first analog signal $VQ_{CB}$ and the second analog signal $VQ_B$. The differential circuit 64 may comprise a phase difference detector.

The differential signal, which is output from the differential circuit 64, is input to the AND circuit 66. The AND circuit 66 also is supplied with a clock signal (pulse train). The clock signal may be a reference clock signal, or a clock signal generated from the reference clock signal. The AND circuit 66 outputs the supplied clock signal to the counter circuit 68 only during a period in which the differential signal output from the differential circuit 64 is of a high level. Therefore, a pulse train, which depends on the differential signal, is output to the counter circuit 68.

The counter circuit 68 counts pulses of the pulse train output from the AND circuit 66. Since the first analog signals $VQ_{CA}$, $VQ_{CB}$ and the second analog signals $VQ_A$, $VQ_B$ include analog signals of a black level as well as analog signals of a signal level, the differential signals also include a differential signal of a black level and a differential signal of a signal level. Since the pixel-originated signals are defined by "– black level + signal level", the counter circuit 68 is capable of generating a differential signal, which represents the difference produced by subtracting the signal originating from the first pixel 10a or 10b from the signal originating from the second pixel 10c or 10d, by performing a subtractive process on the pulse count value of a pulse train, which depends on the differential signal of the black level, and the pulse count value of a pulse train, which depends on the differential signal of the signal level.

According to the present embodiment, the counter circuit 68 is a counter circuit, which only by counting up pulses, is effectively capable of both counting up and counting down pulses. The count value (digital value) generated by the counter circuit 68 is transferred through the switch 46 to the horizontal transfer line 48, which outputs a digital count value from the counter circuit 68 through the output circuit 50.

Figure 8:
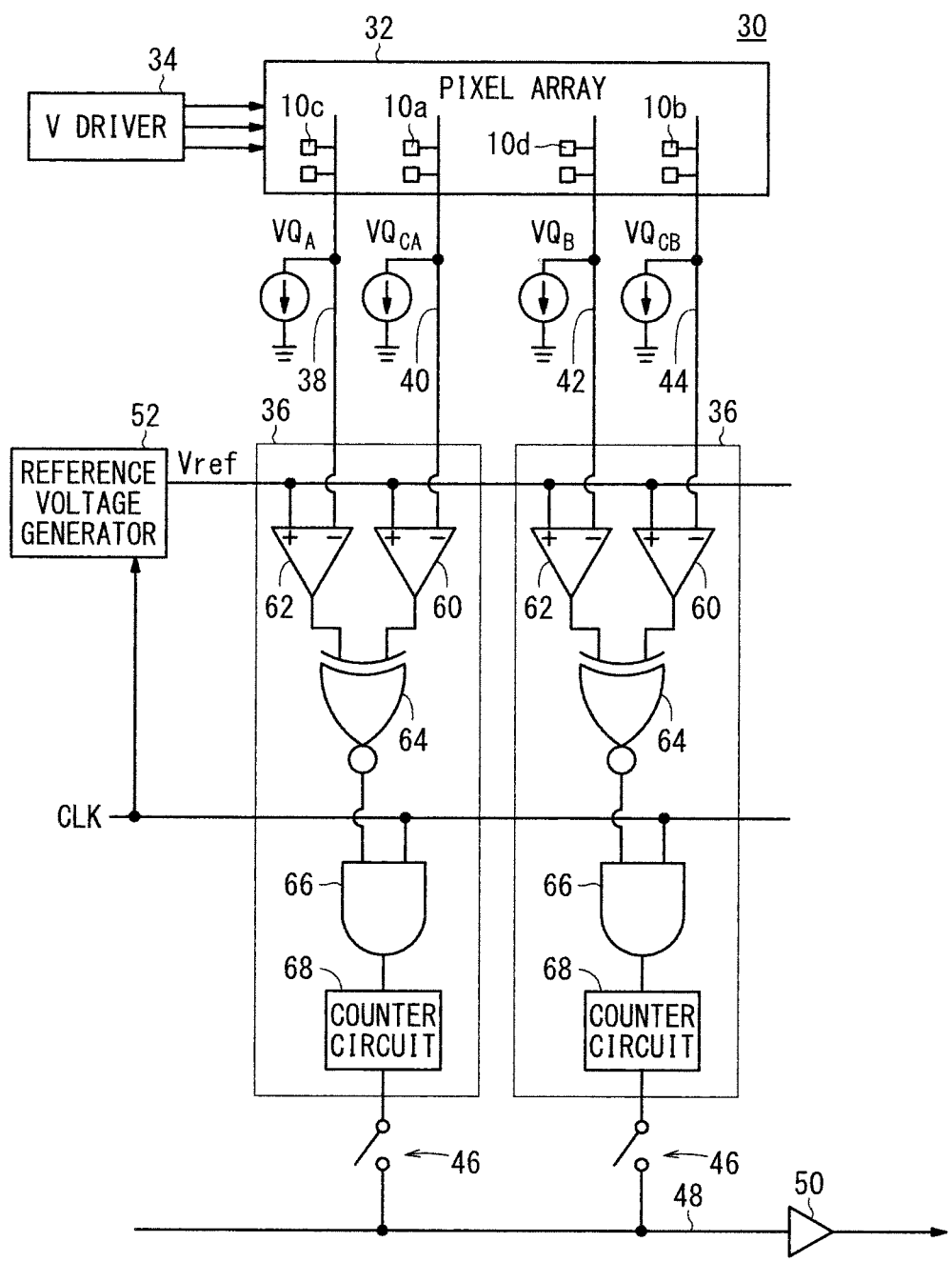
FIG. 8 is a block diagram of an arrangement of a solid-state image sensing device according to an embodiment of the present invention.

An arrangement of the counter circuit 68, which is shown in FIG. 8, will be described below with reference to FIG. 9. The counter circuit 68, which is a bit-flip asynchronous counter circuit, includes a plurality of (positive-edge-triggered) flip-flop circuits 70, a plurality of switch circuits 72, a control signal generating circuit 74, and a pulse generating circuit 76.

The flip-flop circuits 70 count up the pulses of the pulse train that is input to the counter circuit 68. The switch circuits 72 and the flip-flop circuits 70 are alternately connected. The flip-flop circuits 70 may be D-type flip-flop circuits. The flip-flop circuits 70 are connected in cascade through the switch circuits 72. Each of the flip-flop circuits 70 is configured such that an output signal from an inverting output terminal Q bar thereof is input to the input terminal D thereof. The output signal from the inverting output terminal Q bar of each of the flip-flop circuits 70 also is input to a switch circuit 72, which follows the flip-flop circuit 70.

The output signal from an output terminal Q of each of the flip-flop circuits 70 serves as one bit of the count value. The output signal from the output terminal Q of the head flip-flop circuit 70 is represented by Q0, the output signal from the output terminal Q of the second flip-flop circuit 70 is represented by Q1, the output signal from the output terminal Q of the third flip-flop circuit 70 is represented by Q2, and the output signal from the output terminal Q of the (final) flip-flop circuit 70 of the most significant bit is represented by Q3.

The counter circuit 68 includes as many flip-flop circuits 70 and switch circuits 72 as the number of bits to be counted. In FIG. 9, the counter circuit 68 includes four flip-flop circuits 70 and four switch circuits 72. Therefore, the count value produced by the counter circuit comprises four bits. The output signal Q3 from the flip-flop circuit 70 of the most significant bit also functions as a sign bit.

The switch circuits 72 are connected as previous stages of each of the respective flip-flop circuits 70. Each of the switch circuits 72 selects a propagated signal In, or a low-level signal (0), or a high-level signal (1) that is input thereto, and outputs the selected signal as an output signal Out to the clock terminal CK of the flip-flop circuit 70, which follows the switch circuit 72. The head switch circuit 72 is supplied with the pulse train, which is to be counted, as the propagated signal In. Further, each of the switch circuits 72, except for the head switch circuit 72, is supplied with the output signal from the inverting output terminal Q bar of the previous flip-flop circuit 70 as the propagated signal. Each of the switch circuits 72 comprises a 2-to-1 selector. Details of the switch circuits 72 will be described later.

The control signal generating circuit 74 generates a switch circuit control signal BR for controlling each switch circuit 72 to select the propagated signal In, or the low-level signal, or the high-level signal. The control signal generating circuit 74 generates the switch circuit control signal BR using a reference clock signal, or a clock signal that is generated from the reference clock signal. Based on the switch circuit control signal BR, which is generated by the control signal generating circuit 74, each of the switch circuits 72 selects the propagated signal In, or the low-level signal, or the high-level signal, and outputs the selected signal as the output signal Out.

When the switch circuits 72 output the propagated signal In as the output signal Out, the flip-flop circuits 70 count the pulses of the pulse train that is input to the head switch circuit 72. Thereafter, the control signal generating circuit 74 controls the switch circuits 72 to output a low-level signal, and then controls the switch circuits 72 to output a high-level signal. As a result, the count value produced by the flip-flop circuits 70 is converted into a 1's complement. In other words, a 1's complement of the count value produced by the flip-flop circuits 70 is stored by the flip-flop circuits 70.

The pulse generating circuit 76 generates one pulse for converting the count value produced by the flip-flop circuits 70 into a 2's complement, and inputs the one pulse to the head switch circuit 72. After the count value has been converted into a 1's complement, and then the switch circuits 72 have output the propagated signal In as the output signal Out, the one pulse is input to the head switch circuit 72, whereby the count value produced by the flip-flop circuits 70 is converted into a 2's complement. Thus, the 2's complement is stored in the flip-flop circuits 70.

Figure 9:
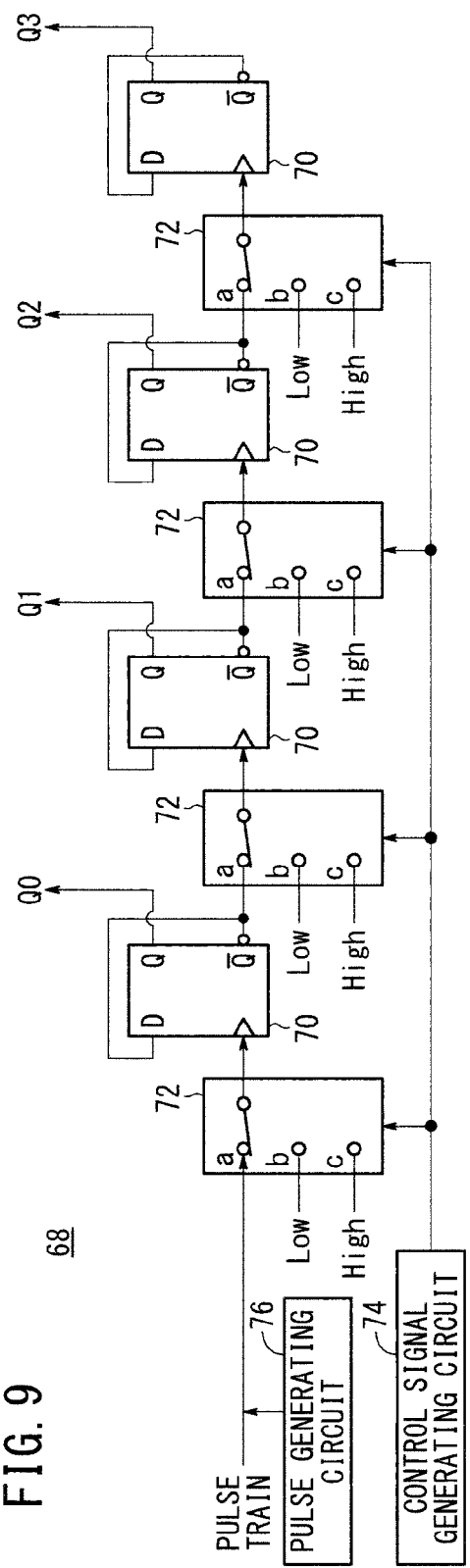
FIG. 9 is a block diagram of a circuit arrangement of a counter device shown in FIG. 8.
Figure 10:
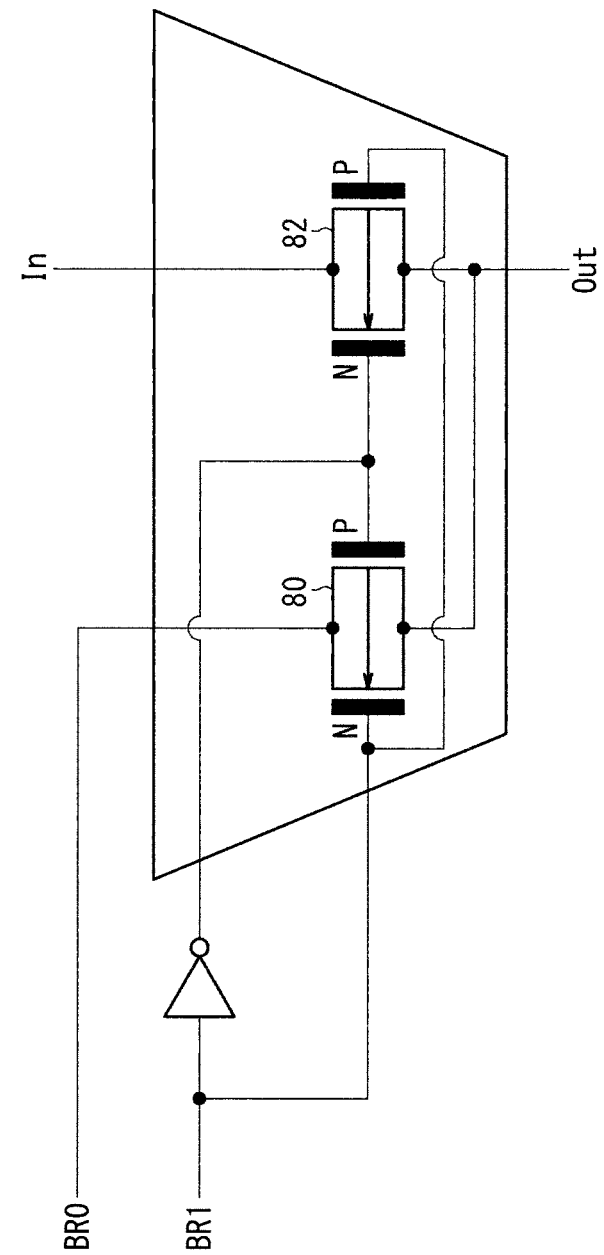
FIG. 10 is a diagram of an example of a circuit arrangement of a switch circuit shown in FIG. 9.

FIG. 10 is a circuit diagram of an example of a circuit arrangement of each of the switch circuits 72 shown in FIG. 9. The switch circuit 72 functions as a 3-to-1 selector, insofar as the switch circuit 72 selects and outputs the propagated signal In, or the low-level signal, or the high-level signal. However, the switch circuit 72 is constructed as a 2-to-1 selector. Therefore, the switch circuit 72 is simple in circuit configuration and occupies only a small chip area. The switch circuit 72 comprises a first transfer gate 80 and a second transfer gate 82. The switch circuit control signal BR has a first control signal BR0, which is input to the first transfer gate 80 for converting the count value of the flip-flop circuits 70 into a 1's complement, and a second control signal BR1, which is used for turning on and off the first transfer gate 80 and the second transfer gate 82. When the second control signal BR1 is applied to the first transfer gate 80 and the second transfer gate 82, the first transfer gate 80 and the second transfer gate 82 are turned on and off in a mutually opposite manner. For example, when the first transfer gate 80 is turned on, the second transfer gate 82 is turned off. The propagated signal In is input to the second transfer gate 82.

Each of the first transfer gate 80 and the second transfer gate 82 comprises a CMOS switch, including an N-channel transistor N and a P-channel transistor P. The second control signal BR1 is directly applied to the gate of the transistor N of the first transfer gate 80, and to the gate of the transistor P of the second transfer gate 82. A signal produced by inverting the second control signal BR1 is directly applied to the gate of the transistor P of the first transfer gate 80, and to the gate of the transistor N of the second transfer gate 82. Such an arrangement makes it possible for the first transfer gate 80 and the second transfer gate 82 to be turned on and off in a mutually opposite manner. The first control signal BR0 and the second control signal BR1 control the output signal Out from the switch circuit 72.

Figure 11:
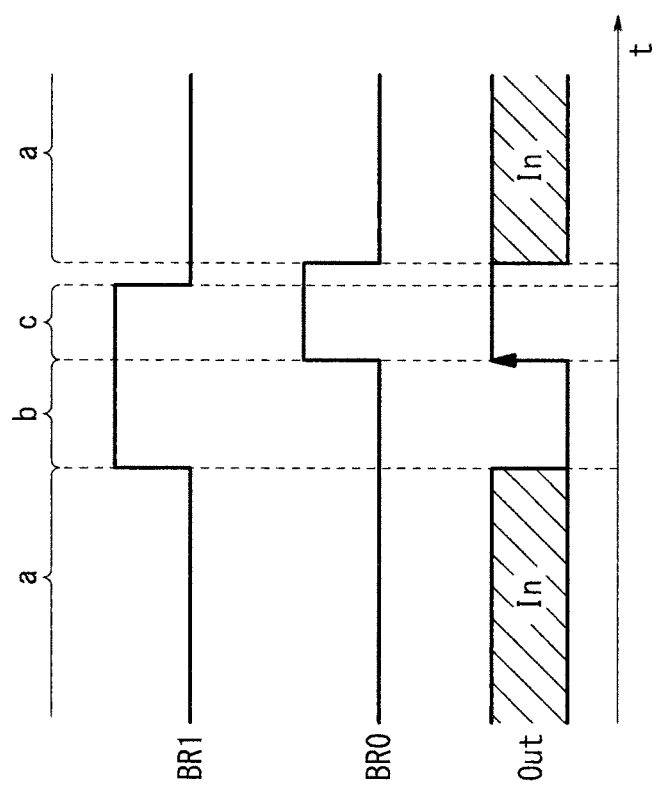
FIG. 11 is a diagram showing the waveform of a signal Out, which is output from the switch circuit by a switch circuit control signal BR.

FIG. 11 is a diagram showing the waveform of the output signal Out from the switch circuit 72, in the case that the switch circuit control signal BR is applied to the switch circuit 72. When the first control signal BR0 and the second control signal BR1 are low in level, the first transfer gate 80 is turned off and the second transfer gate 82 is turned on. Further, when the propagated signal In is input to the second transfer gate 82, the switch circuit 72 outputs the propagated signal In as the output signal Out. A state in which the first control signal BR0 and the second control signal BR1 are both low in level is referred to as a state "a".

In state "a", the switch circuit control signal BR makes it possible for the propagated signal In to be input from each switch circuit 72 to the clock terminal CK of the following flip-flop circuit 70.

Then, the first control signal BR0 remains low in level while the second control signal BR1 goes high in level. Since, at this time, the first transfer gate 80 is turned on and the second transfer gate 82 is turned off, the switch circuit 72 outputs the first control signal BR0, which is input to the first transfer gate 80, as the output signal Out. Since the first control signal BR0, which is input to the first transfer gate 80, is low in level, the output signal Out also is low in level. A state in which the first control signal BR0 is low in level and the second control signal BR1 is high in level is referred to as a state "b". In state "b", the switch circuit control signal BR makes it possible for the low-level output signal Out to be input from each switch circuit 72 to the clock terminal CK of the following flip-flop circuit 70.

Then, the second control signal BR1 remains high in level, while the first control signal BR0 goes high in level. Since, at this time, the first transfer gate 80 is turned on and the second transfer gate 82 remains turned off, the switch circuit 72 outputs the first control signal BR0, which is input to the first transfer gate 80, as the output signal Out. Since the first control signal BR0, which is input to the first transfer gate 80, is high in level, the output signal Out also is high in level. A state in which the first control signal BR0 and the second control signal BR1 are both high in level is referred to as a state "c". In state "c", the switch circuit control signal BR makes it possible for the high-level output signal Out to be input from each switch circuit 72 to the clock terminal CK of the following flip-flop circuit 70. When the state "b" switches to the state "c", the output signal Out of the switch circuit 72 switches from a low level to a high level. Therefore, the state value of each flip-flop circuit 70 becomes inverted. In other words, the count value is converted into a 1's complement.

The switch circuit 72 changes from the state "a", to the state "b", and then to the state "c", and back to the state "a". When the switch circuit 72 returns from the state "c" to the state "a", the timing at which the first control signal BR0 changes from a high level to a low level is delayed from the timing at which the second control signal BR1 changes from the high level to the low level, in order to prevent the output signal Out from suffering from hazards.

As described above, although the switch circuit 72 comprises a 2-to-1 selector, the switch circuit 72 can perform the functions of a 3-to-1 selector based on the switch circuit control signal.

Figure 12:
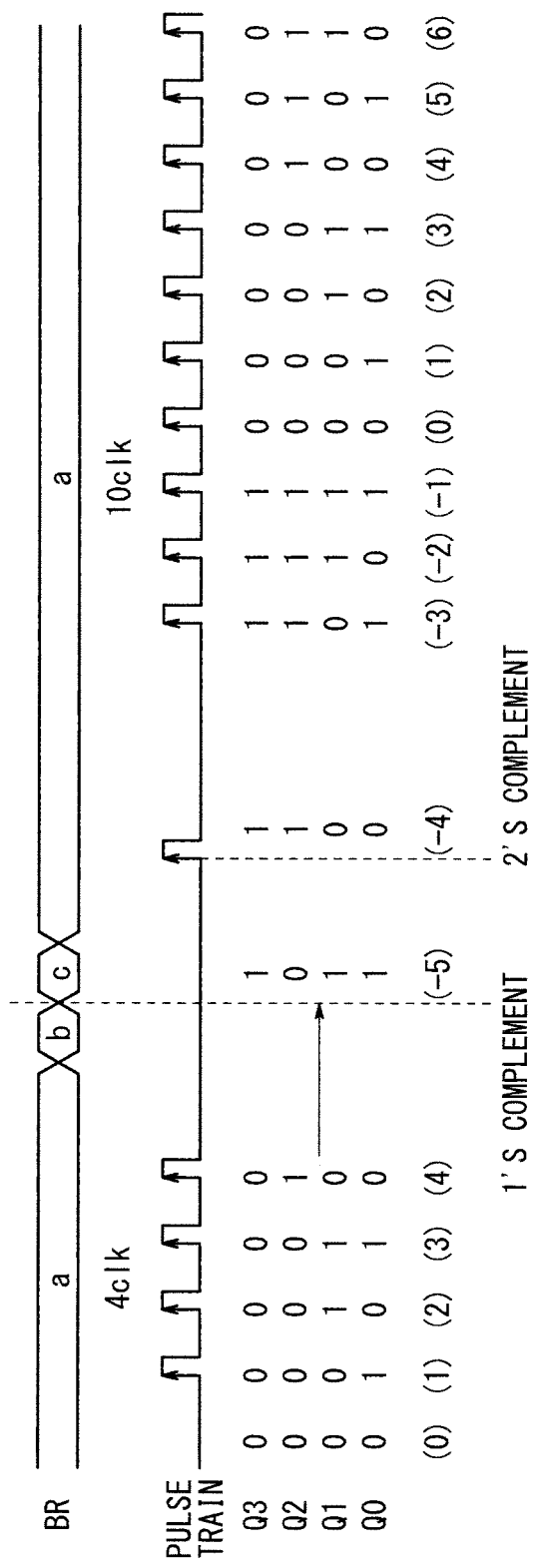
FIG. 12 is a timing chart of an operation sequence of a counter circuit shown in FIG. 9.

FIG. 12 is a timing chart of operations of the counter circuit 68 shown in FIG. 9. In FIG. 12, it is assumed that the pulse train (first pulse train), which depends on the differential signal of the black level, and the pulse train (second pulse train), which depends on the differential signal of the signal level, are input to the head switch circuit 72. The first pulse train is a pulse train to be counted down, whereas the second pulse train is a pulse train to be counted up.

In a black level counting period, during which the pulses of the first pulse train are counted, the switch circuit control BR brings the switch circuit 72 into the state "a". The first pulse train is input to the head switch circuit 72. The counter circuit 68 is initialized in order to render the signals output from the output terminals Q low in level before the counter circuit 68 counts the pulses of the first pulse train. In other words, all the flip-flop circuits 70 are reset, so as to set the output terminals Q to "0".

When the first pulse train is input to the head switch circuit 72, the pulses of the first pulse train are counted by the counter circuit 68. For example, when a pulse is input to the head switch circuit 72, since the output signal Q0 has a value of "1" and the output signals Q1, Q2, Q3 have respective values of "0", the count value of the counter circuit 68 becomes "0001" (1). As pulses are input successively to the head switch circuit 72, the count value of the counter circuit 68 is incremented to "0010" (2), to "0011" (3), and to "0100" (4), etc. The values in the parentheses following the above count values represent the count values as expressed in decimal notation.

After elapse of the black level counting period, the switch circuit control signal BR brings the switch circuit 72 into the state "b" and then into the state "c". At this time, the state values held by the respective flip-flop circuits 70 become inverted. In other words, the present count value is converted into a 1's complement. The state values are inverted after the count value has reached "0100". Therefore, the inverted count value is represented by "1011" (11). The count value of the flip-flop circuit 70 of the most significant bit functions as a sign bit. When the output signal Q3 is a value of "0", it indicates positive, and when the output signal Q3 is a value of "1", it indicates negative. If the count value "1011" is expressed as a 2's complement in decimal notation, then the count value becomes −5.

After the count value has been converted into a 1's complement, the switch circuit control signal BR brings the switch circuit 72 into state "a". Before a signal level counting period begins (i.e., before the second pulse train is input thereto), the pulse generating circuit 76 inputs one generated pulse to the head switch circuit 72. At this time, the count value produced in the black level counting period is converted into a 2's complement. When the one generated pulse is input to the head switch circuit 72, the count value has a value representing the sum of "1011", which is a 1's complement, and 1. In other words, the count value produced in the black level counting period is converted into a 2's complement. After the count value has been converted into a 2's complement, the count value is represented by "1100" (−4). Thereafter, when the second pulse train is input to the head switch circuit 72, the counter circuit 68 counts the pulses of the second pulse train from −4.

By converting the count value, which is produced by counting the pulses of the first pulse train into a 1's complement, and then converting the count value into a 2's complement, the result obtained by counting up the pulses of the first pulse train is the same as the result obtained by counting down the pulses of the first pulse train. Therefore, the final count value is a count value representing "− a differential signal of a black level + a differential signal of a signal level".

Inasmuch as the flip-flop circuit 70 of the most significant bit functions as a sign bit, the maximum number of bits that can be counted is equal to the number of flip-flop circuits 70, except for the flip-flop circuit 70 of the most significant bit. Therefore, the number of flip-flop circuits 70 used should be changed depending on the value that is to be counted. If each of the flip-flop circuits 70 is a negative-edge-triggered flip-flop circuit, then a control signal having a waveform, which is an inversion of the waveform of the first control signal BR0 shown in FIG. 11, is applied as the first control signal BR0 to the first transfer gate 80. Depending on the configuration of the flip-flop circuits 70, the signals output from the switch circuits 72 can be varied. More specifically, the count value may be converted into a 2's complement when the black level counting period transfers to the signal level counting period.

Figure 13:
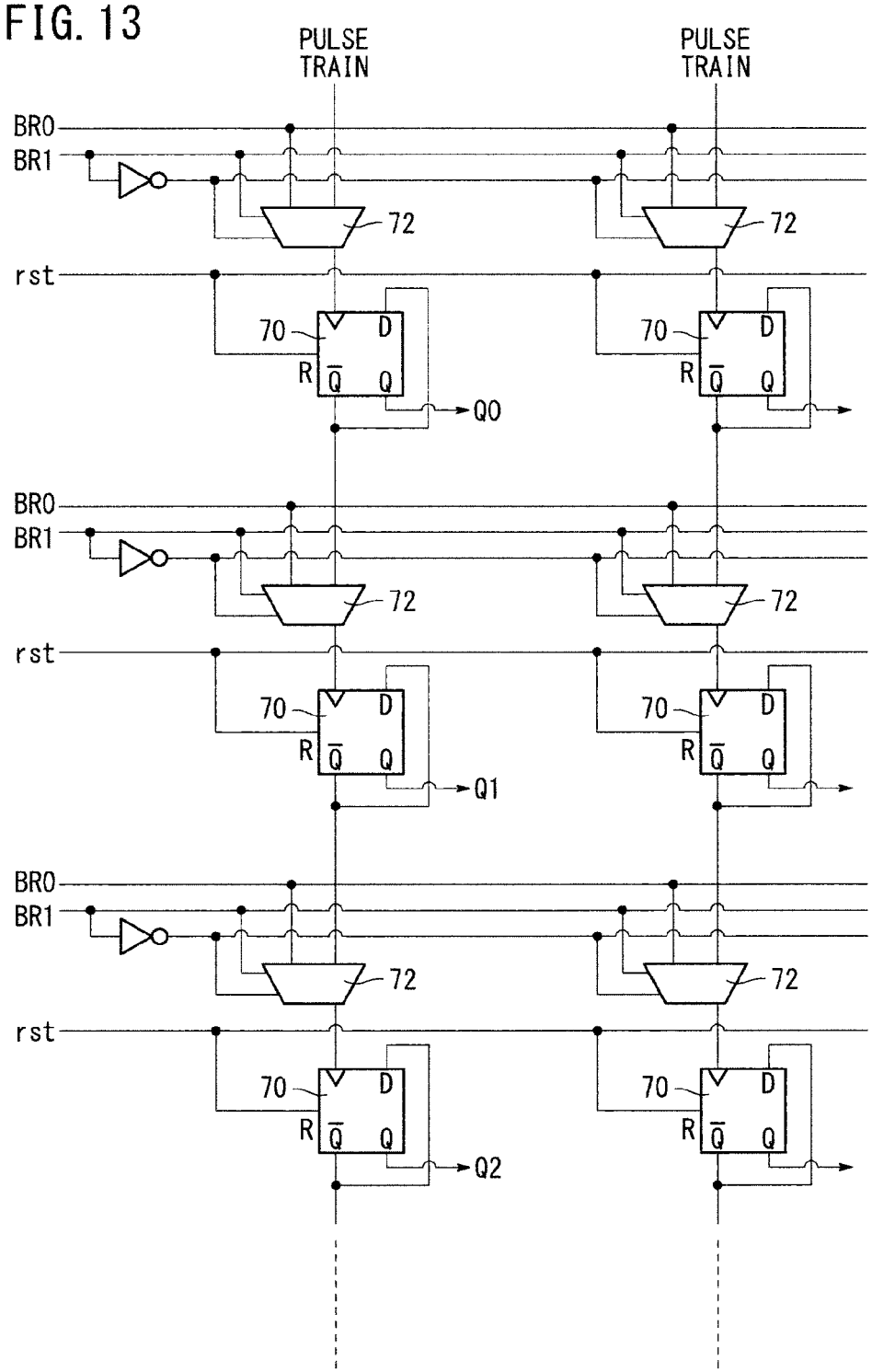
FIG. 13 is a block diagram showing by way of example a plurality of counter circuits connected in a parallel layout.

FIG. 13 is a block diagram showing, by way of example, a plurality of counter circuits 68 connected in a parallel layout. The counter circuits 68 are positioned in association with the respective columns of pixels of the solid-state image sensing device. As shown in FIG. 13, in the event that the counter circuits 68 have a large number of bits, if the number of elements of the switch circuits 72 is reduced, then the installation area taken up by the counter circuits 68 can be reduced as well. According to the present embodiment, since each of the switch circuits 72, which is constructed as a 2-to-1 selector, also functions as a 3-to-1 selector, the number of elements of the switch circuits 72 is smaller than they would be if constructed as 3-to-1 selectors, thereby resulting in a reduction in size of the installation area taken up by the counter circuits 68. In FIG. 13, the control signal generating circuit 74 and the pulse generating circuit 76 have been omitted from illustration. A resetting signal rst is input to the flip-flop circuits 70. When the resetting signal rst is input to the flip-flop circuits 70, the flip-flop circuits 70 are initialized, so as to set the output signals thereof to "0".

Since the count value produced by the flip-flop circuits 70 is converted into a 1's complement and a 2's complement, the counter circuits 68, which normally function only to count up pulses, can function as counter circuits for both counting up and counting down pulses. Since the counter circuits 68 only count up pulses, the circuit operation thereof is simple, thereby making the switch circuits 72 simple in configuration and reducing the installation area for the counter circuits 68. Since the count value is expressed as a 2's complement, the count value can easily be handled by digital logic circuits, and the addition of a plurality of pixel values using a counter can be coped with.

An example of operations of the solid-state image sensing device 30 shown in FIG. 8 will be described below. In FIG. 8, the difference between the second analog signal $VQ_A$ and the first analog signal $VQ_{CA}$ is determined and converted into a digital value. The V driver 34 outputs pixel resetting signals to the first pixel 10a and the second pixel 10c, so that the first analog signal $VQ_{CA}$, which is of a black level, is read from the first pixel 10a through the vertical signal line 40, and the second analog signal $VQ_A$, which is of a black level, is read from the second pixel 10c through the vertical signal line 38.

The first analog signal $VQ_{CA}$, of the black level, which is read, is input to the negative terminal of the first comparator 60, and the second analog signal $VQ_A$ of the black level, which is read, is input to the negative terminal of the second comparator 62. The reference voltage is applied respectively to the positive terminals of the first comparator 60 and the second comparator 62. The reference voltage has a voltage waveform, the level of which decreases gradually in a first AD conversion period (black level counting period), during which analog signals of a black level are converted into digital signals, and in a second AD conversion period (signal level counting period), during which analog signals of a signal level are converted into digital signals. The level of the reference voltage returns to its original level upon elapse of the first AD conversion period and the second AD conversion period.

The first comparator 60 compares the reference voltage and the first analog signal $VQ_{CA}$ of the black level with each other, and outputs a signal depending on the first analog signal $VQ_{CA}$ of the black level. More specifically, the first comparator 60 outputs a high-level signal if the reference voltage is greater than the first analog signal $VQ_{CA}$ of the black level, and outputs a low-level signal if the reference voltage is smaller than the first analog signal $VQ_{CA}$ of the black level. The second comparator compares the reference voltage and the second analog signal $VQ_A$ of the black level with each other, and outputs a signal depending on the second analog signal $VQ_A$ of the black level. More specifically, the second comparator 62 outputs a high-level signal if the reference voltage is greater than the second analog signal $VQ_A$ of the black level, and outputs a low-level signal if the reference voltage is smaller than the second analog signal $VQ_A$ of the black level. The first comparator 60 and the second comparator 62 will be described in detail later.

Figure 14:
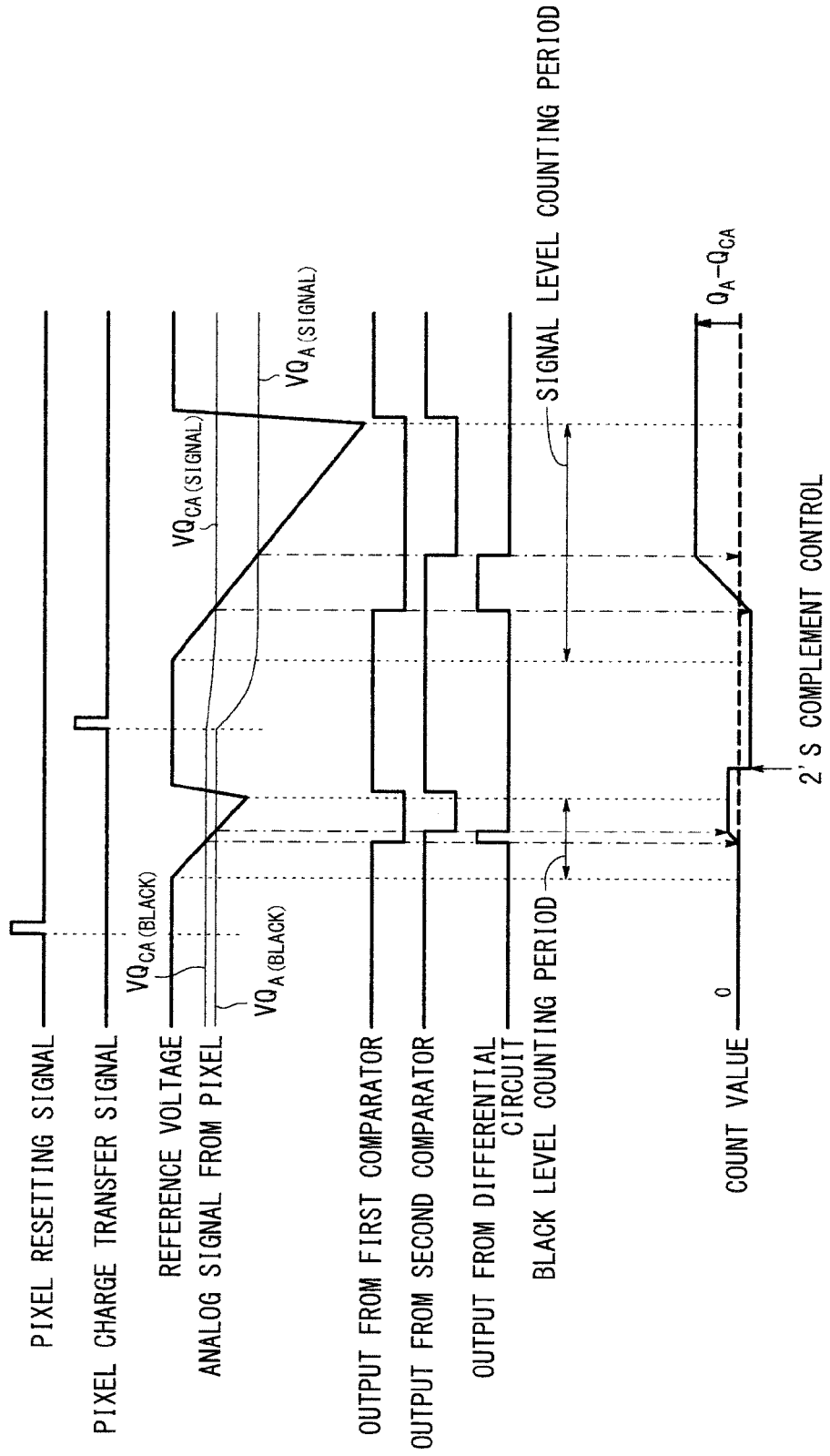
FIG. 14 is a timing chart of an example of operations of the solid-state image sensing device shown in FIG. 8.

As shown in FIG. 14, if the first analog signal $VQ_{CA}$ of the black level is higher in level than the second analog signal $VQ_A$ of the black level, then the timing of a negative-going edge of the signal depending on the second analog signal $VQ_A$ of the black level, which is output from the second comparator 62, is later than the timing of a negative-going edge of the signal depending on the first analog signal $VQ_{CA}$ of the black level, which is output from the first comparator 60. Therefore, the differential signal output from the differential circuit 64 represents "the second analog signal $VQ_A$ of the black level minus (−) the first analog signal $VQ_{CA}$ of the black level". The counter circuit 68 counts pulses of the pulse train depending on the differential signal of the black level (the pulse train output from the AND circuit 66 during a period in which the differential signal of the black level is high in level), and the analog signal, which represents "the second analog signal $VQ_A$ of the black level minus (−) the first analog signal $VQ_{CA}$ of the black level", is converted into a digital signal.

After the black level counting period and before the signal level counting period, the counter circuit 68 performs the aforementioned 2's complement control process in order to convert the count value into a 2's complement. Thereafter, the V driver 34 outputs a pixel charge transfer signal to the first pixel 10a and the second pixel 10c, so as to turn on the switches SW1, thereby transferring the photoelectrons stored in the photodetectors 12 to the FDs 14, and then the V driver 34 turns off the switches SW1. The first analog signal $VQ_{CA}$ of a signal level is read from the first pixel 10a through the vertical signal line 40, and the second analog signal $VQ_A$ of a signal level is read from the second pixel 10c through the vertical signal line 38.

The first analog signal $VQ_{CA}$ of the signal level, which is read, is input to the negative terminal of the first comparator 60, and the second analog signal $VQ_A$ of the signal level, which is read, is input to the negative terminal of the second comparator 62. The reference voltage is applied respectively to the positive terminals of the first comparator 60 and the second comparator 62.

The first comparator 60 compares the reference voltage and the first analog signal $VQ_{CA}$ of the signal level with each other, and outputs a signal depending on the first analog signal $VQ_{CA}$ of the signal level. The second comparator 62 compares the reference voltage and the second analog signal $VQ_A$ of the signal level with each other, and outputs a signal depending on the second analog signal $VQ_A$ of the signal level.

As shown in FIG. 14, if the first analog signal $VQ_{CA}$ of the signal level is higher in level than the second analog signal $VQ_A$ of the black level, then the timing of a negative-going edge of the signal depending on the second analog signal $VQ_A$ of the signal level, which is output from the second comparator 62, is later than the timing of a negative-going edge of the signal depending on the first analog signal $VQ_{CA}$ of the signal level, which is output from the first comparator 60. Therefore, the differential signal output from the differential circuit 64 represents "the second analog signal $VQ_A$ of the signal level minus (–) the first analog signal $VQ_{CA}$ of the signal level", which is an analog signal of a signal level from which ambient light has been removed. The differential signal thus represents an analog signal of a signal level produced as if the pixel 10 detected only reflected light from the subject illuminated by the illuminating unit. The counter circuit 68 counts the pulses of the pulse train depending on the differential signal of the signal level (the pulse train output from the AND circuit 66 during a period in which the differential signal of the signal level is of a high level), and the analog signal, which represents "the second analog signal $VQ_A$ of the signal level minus (–) the first analog signal $VQ_{CA}$ of the signal level", is converted into a digital signal.

The counter circuit 68 converts the count value produced by counting up the pulses of a pulse train depending on the differential signal of the black level into a 2's complement, and counts up the pulses of a pulse train depending on the differential signal of the signal level. As a result, the counter circuit 68 can produce a digital value representing "– a differential signal of a black level + a differential signal of a signal level". Therefore, the counter circuit 68 can produce a digital value of the differential signal produced by subtracting the signal originating from the first pixel 10a from the signal originating from the second pixel 10c. In other words, the counter circuit 68 can produce a digital value representing the incident light energy $Q_A$ minus (–) the incident light energy $Q_{CA}$, which was described above with reference to FIG. 1. It has been described above that the difference between the second analog signal $VQ_A$ and the first analog signal $VQ_{CA}$ is calculated, whereupon the obtained differential signal is converted into a digital signal. However, the difference between the second analog signal $VQ_B$ and the first analog signal $VQ_{CB}$ may similarly be calculated, and the obtained differential signal may similarly be converted into a digital signal. Consequently, the description of conversion of the differential signal between the second analog signal $VQ_B$ and the first analog signal $VQ_{CB}$ into a digital value is omitted.

Figure 15:
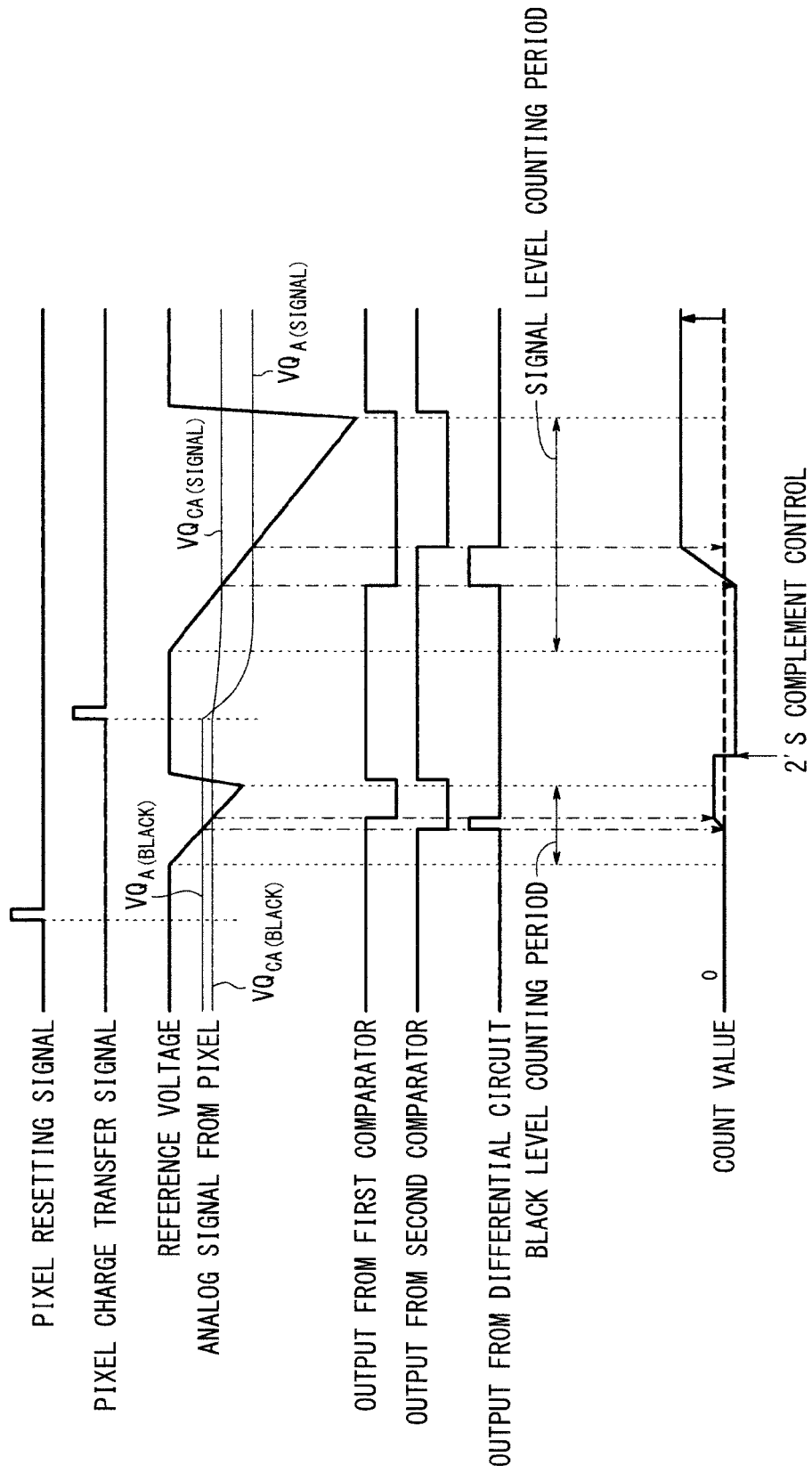
FIG. 15 is a timing chart of another example of operations of the solid-state image sensing device shown in FIG. 8.

The relationship between the black levels of $VQ_A$ and $VQ_{CA}$ is random, since the relationship depends on noise at the instant of the signals. For example, as shown in FIG. 15, the second analog signal $VQ_A$ of the black level may be higher than the first analog signal $VQ_{CA}$ of the black level. In this case, the timing of a negative-going edge of the signal depending on the second analog signal $VQ_A$ of the black level, which is output from the second comparator 62, is earlier than the timing of a negative-going edge of the signal depending on the first analog signal $VQ_{CA}$ of the black level, which is output from the first comparator 60. Therefore, the differential signal output from the differential circuit 64 represents "– the second analog signal $VQ_A$ of the black level + the first analog signal $VQ_{CA}$ of the black level", with the signs (+, –) thereof inverted. The counter circuit 68 counts the pulses of the pulse train depending on the differential signal.

If the period in which the differential signal output from the differential circuit 64 in the black level counting period shown in FIG. 15 is high in level, and the period in which the differential signal output from the differential circuit 64 in the black level counting period shown in FIG. 14 is high in level are of the same length, then the pulse count value of the pulse train depending on the differential signal of the black level counted in FIG. 15, and the pulse count value of the pulse train depending on the differential signal of the black level counted in FIG. 14 are identical to each other, although the pulse count values are of opposite signs.

As shown in FIG. 15, since the second analog signal $VQ_A$ of the signal level is lower in level than the first analog signal $VQ_{CA}$ of the signal level, the timing of a negative-going edge of the signal depending on the second analog signal $VQ_A$ of the signal level, which is output from the second comparator 62, is later than the timing of a negative-going edge of the signal depending on the first analog signal $VQ_{CA}$ of the signal level, which is output from the first comparator 60. Thus, the differential signal of the signal level output from the differential circuit 64 represents "the second analog signal $VQ_A$ of the signal level minus (–) the first analog signal $VQ_{CA}$ of the signal level". The counter circuit 68 counts the pulses of the pulse train depending on the differential signal.

If the period during which the differential signal of the signal level in FIG. 15 is high in level, and the period during which the differential signal of the signal level in FIG. 14 is high in level are of the same length, then the pulse count value of the pulse train depending on the differential signal of the signal level, which is counted as shown in FIG. 15, and the pulse count value of the pulse train depending on the differential signal of the signal level, which is counted as shown in FIG. 14, are identical to each other.

As shown in FIG. 15, even if the first analog signal $VQ_{CA}$ and the second analog signal $VQ_A$ are sent to the first comparator 60 and the second comparator 62, the counter circuit 68 performs the 2's complement control process in order to convert the count value into a 2's complement, after the black level counting period and before the signal level counting period. Therefore, the counter circuit 68 is not able to produce a digital value representing "the incident light energy $Q_A$ minus (–) the incident light energy $Q_{CA}$", but rather, the counter circuit 68 produces a digital value, which is the same as the count value shown in FIG. 14 (i.e., a digital value of a differential signal produced by subtracting the signal originating from the first pixel 10a from the signal originating from the second pixel 10c).

Thus, the first comparator 60 and the second comparator 62 are set such that the timing of a negative-going edge of the signal output from the second comparator 62 is later than the timing of a negative-going edge (the inversion timing) of the signal output from the first comparator 60, thereby solving the problem that the same count value is produced (the signs thereof cannot be determined) if the difference is the same, even though the relationship between the levels of $VQ_A$ and $VQ_{CA}$ is different. In other words, the auto-zero levels of the first comparator 60 and the second comparator 62 are made different.

Figure 16:
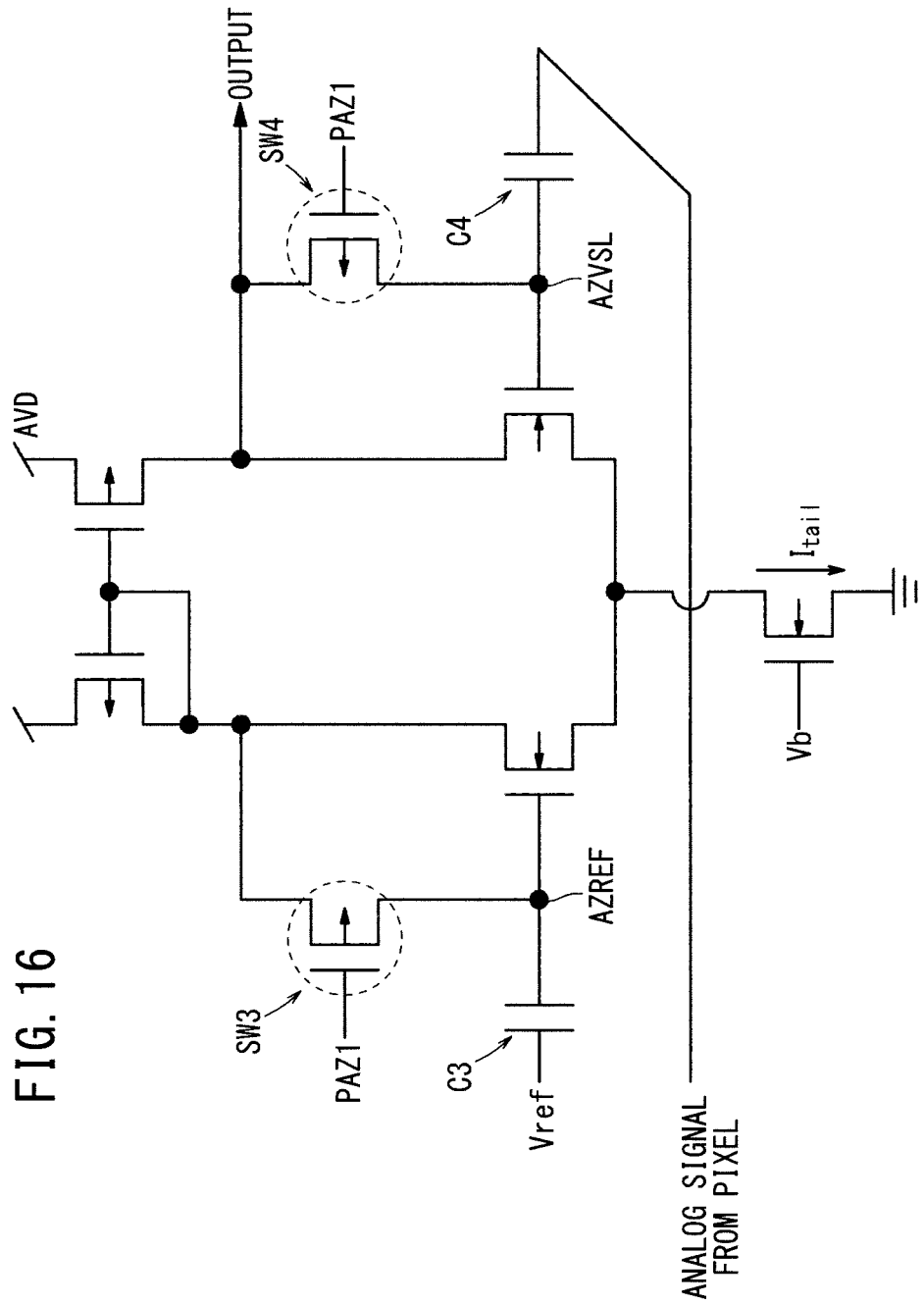
FIG. 16 is a circuit diagram of an arrangement of a first comparator shown in FIG. 8.
Figure 17:
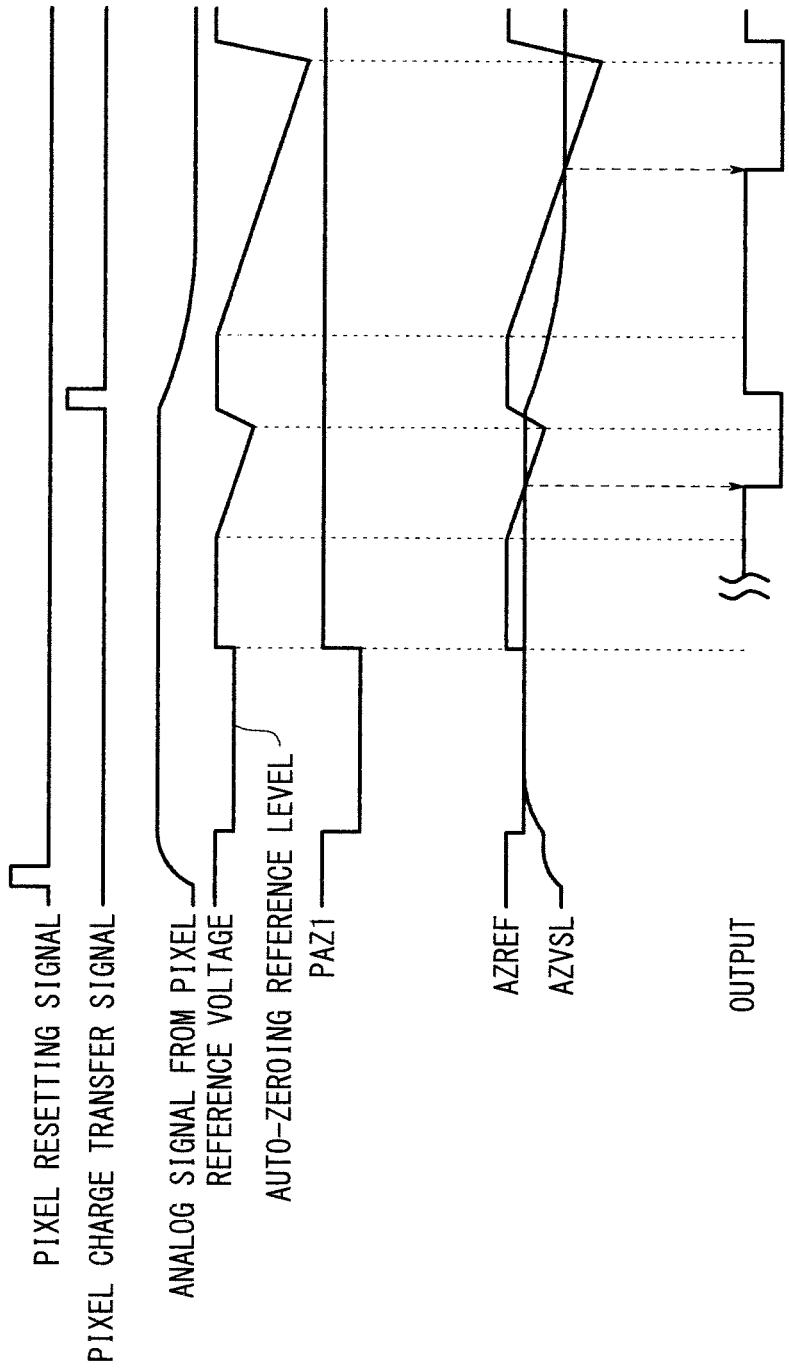
FIG. 17 is a timing chart of operations of the first comparator and a second comparator.

FIG. 16 is a circuit diagram of an arrangement of the first comparator 60, and FIG. 17 is a timing chart showing operations of the first comparator 60. Since the second comparator 62 is of the same arrangement as the first comparator 60, only the first comparator 60 will be described below. A reference voltage is applied to an end of a capacitor C3, to which the switch SW3 is not connected, and the first analog signal $VQ_{CA}$ or $VQ_{CB}$ is input from the first pixel 10a or 10b to an end of a capacitor C4, to which the switch SW4 is not connected. The first analog signal $VQ_{CA}$ or $VQ_{CB}$ from the first pixel 10a or 10b includes the first analog signal $VQ_{CA}$ or $VQ_{CB}$ of the black level, and the first analog signal $VQ_{CA}$ or $VQ_{CB}$ of the signal level.

The waveform of the reference voltage has a reference level prior to the ramp waveform thereof for auto-zeroing the first comparator 60. When a pixel resetting signal is supplied to the first pixel 10a or 10b, the first analog signal $VQ_{CA}$ or $VQ_{CB}$ of the black level is input to the first comparator 60. Thereafter, when the reference voltage, which has a reference level for auto-zeroing the first comparator 60, is input to the first comparator 60, a PAZ1 signal of a low level is input to the switch SW3 and to the switch SW4, thereby turning on the switch SW3 and the switch SW4. When the switch SW3 and the switch SW4 are turned on, a node AZREF between the switch SW3 and the capacitor C3, and a node AZVSL between the switch SW4 and the capacitor C4 are maintained at the same potential. The capacitor C3 stores photoelectrons as a first offset voltage (a voltage level representing the reference level for auto-zeroing the first comparator 60–the voltage level AZREF), and the capacitor C4 stores photoelectrons as a second offset voltage (a voltage level representing the first analog signal $VQ_{CA}$ or $VQ_{CB}$ of the black level–the voltage level AZVSL). The process of turning on the switch SW3 and the switch SW4, so as to maintain the same potential at the node AZREF and the node AZVSL, is referred to as auto-zeroing.

Thereafter, the PAZ1 signal of a high level is input to the switch SW3 and the switch SW4, thereby turning off the switch SW3 and the switch SW4. After the switch SW3 and the switch SW4 have been turned off, the AZREF voltage level varies depending on a change in the reference voltage (the AZREF voltage level=the reference voltage–the first offset voltage), and the AZVSL voltage level varies depending on a change in the first analog signal $VQ_{CA}$ or $VQ_{CB}$ (the AZVSL voltage level=the first analog signal $VQ_{CA}$ or $VQ_{CB}$– the second offset voltage). If the AZREF voltage level is greater than the AZVSL voltage level, then the first comparator 60 outputs a high-level signal. If the AZREF voltage level becomes smaller than the AZVSL voltage level, then the first comparator 60 inverts the output signal, thereby outputting a low-level signal. The voltage across the capacitor C3 of the second comparator 62 is referred to as a third offset voltage, and the voltage across the capacitor C4 is referred to as a fourth offset voltage. The PAZ1 signal is generated by a non-illustrated signal generating circuit.

Since the first comparator 60 and the second comparator 62 include the above functions, the reference level for auto-zeroing the second comparator 62 is lower than the reference level for auto-zeroing the first comparator 60, in order to make the inversion timing of the signal output from the second comparator 62 later than the inversion timing of the signal output from the first comparator 60. In other words, the reference voltage has a first reference level for auto-zeroing the first comparator 60, and a second reference level for auto-zeroing the second comparator 62. While the reference voltage at the first reference level is input to the first comparator 60, the switch SW3 and the switch SW4 of the first comparator 60 are turned on in order to auto-zero the first comparator 60. While the reference voltage at the second reference level is input to the second comparator 62, the switch SW3 and the switch SW4 of the second comparator 62 are turned on in order to auto-zero the second comparator 62.

Figure 18:
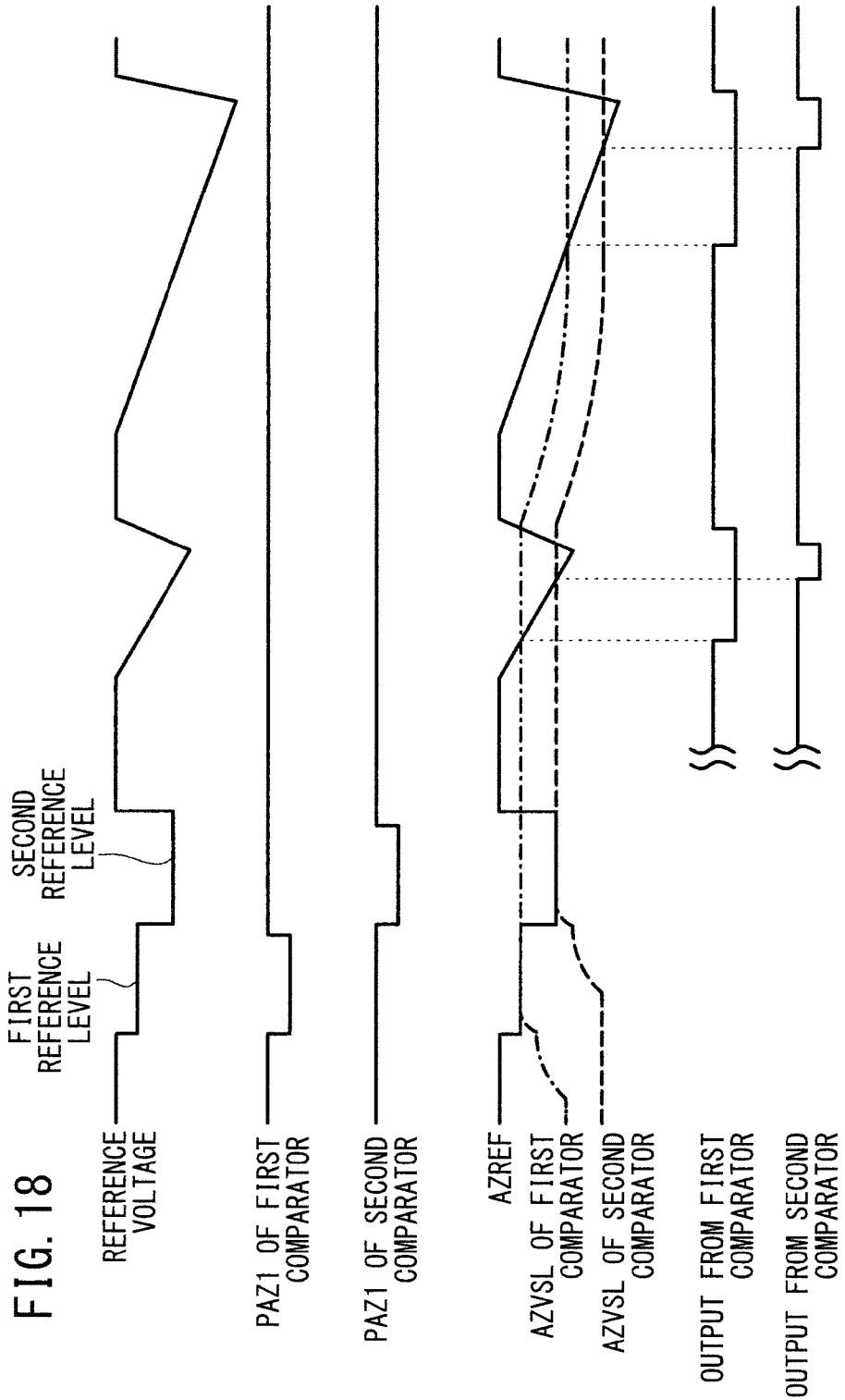
FIG. 18 is a timing chart of operations of the first comparator and the second comparator, which are auto-zeroed at different levels.

FIG. 18 is a timing chart showing operations of the first comparator 60 and the second comparator 62, which are auto-zeroed at different levels.

The reference voltage has a first reference level for auto-zeroing the first comparator 60, and a second reference level for auto-zeroing the second comparator 62 prior to the black level counting period. When the reference voltage at the first reference level is input to the first comparator 60 and the second comparator 62, a low level PAZ1 signal is input to the switch SW3 and the switch SW4 of the first comparator 60, thereby turning on the switch SW3 and the switch SW4 of the first comparator 60 (auto-zeroing the first comparator 60 with the first reference level). When the switch SW3 and the switch SW4 of the first comparator 60 are turned on, the AZREF voltage level and the AZVSL voltage level in the first comparator 60 are brought to the same potential. Thereafter, the switch SW3 and the switch SW4 of the first comparator 60 are turned off prior to the reference voltage being shifted from the first reference level to the second reference level.

When the reference voltage at the second reference level is input to the first comparator 60 and the second comparator 62, a low level PAZ1 signal is input to the switch SW3 and the switch SW4 of the second comparator 62, thereby turning on the switch SW3 and the switch SW4 of the second comparator 62 (auto-zeroing the second comparator 62 with the second reference level). When the switch SW3 and the switch SW4 of the second comparator 62 are turned on, the AZREF voltage level and the AZVSL voltage level in the second comparator 62 are brought to the same potential. Thereafter, the switch SW3 and the switch SW4 of the second comparator 62 are turned off prior to the reference voltage being shifted from the second reference level to the initial level.

If the AZREF voltage level is greater than the AZVSL voltage level in the first comparator 60, then the first comparator 60 outputs a high-level signal. If the AZREF voltage level becomes smaller than the AZVSL voltage level, then the first comparator 60 inverts the output signal, thereby outputting a low-level signal. If the AZREF voltage level is greater than the AZVSL voltage level in the second comparator 62, then the second comparator 62 outputs a high-level signal. If the AZREF voltage level becomes smaller than the AZVSL voltage level, then the second comparator 62 inverts the output signal, thereby outputting a low-level signal. Since the second reference level is lower than the first reference level, the timing at which the signal output from the second comparator 62 changes from the high level to the low level occurs later than the timing at which the signal output from the first comparator 60 changes from the high level to the low level.

Therefore, even if the second analog signals $VQ_A$, $VQ_B$ are higher in level than the first analog signals $VQ_{CA}$, $VQ_{CB}$, the timing of a negative-going edge of a signal output from the second comparator 62 depending on the second analog signals $VQ_A$, $VQ_B$ can be made later than the timing of a negative-going edge of a signal output from the first comparator 60 depending on the first analog signals $VQ_{CA}$, $VQ_{CB}$, so that digital values representing the incident light energy $Q_A$ minus (−) the incident light energy $Q_{CA}$, and the incident light energy $Q_B$ minus (−) the incident light energy $Q_{CB}$, as described with reference to FIG. 1, can be produced.

As described above, the digital values, which represent the incident light energy $Q_A$ minus (−) the incident light energy $Q_{CA}$, and the incident light energy $Q_B$ minus (−) the incident light energy $Q_{CB}$, can be produced by subtracting the analog signal representing the incident light energy $Q_{CA}$ or $Q_{CB}$ from the analog signal representing the incident light energy $Q_A$ or $Q_B$.

If the pulses of the pulse trains that depend on the first analog signal $VQ_{CA}$, the first analog signal $VQ_{CB}$, the second analog signal $VQ_A$, and the second analog signal $VQ_B$ are counted, then the number of counter circuits 68 is increased, requiring twice as many counter circuits as the number of counter circuits 68 according to the present embodiment. Therefore, the amount of consumed electric power and the amount of output data are increased, while in addition, the chip area taken up by the counter circuits also is increased. According to the present embodiment, however, since the counter circuits 68 are shared, the number of counter circuits is reduced by one half, and hence, the amount of consumed electric power and the amount of output data are reduced. Further, since the chip area taken up by the counter circuits is reduced, a highly integrated solid-state image sensing device can be provided. Furthermore, noise can be reduced due to the fact that a reduced number of counter circuits 68, which serve as noise sources, are used.

(Modification 1)

Figure 19:
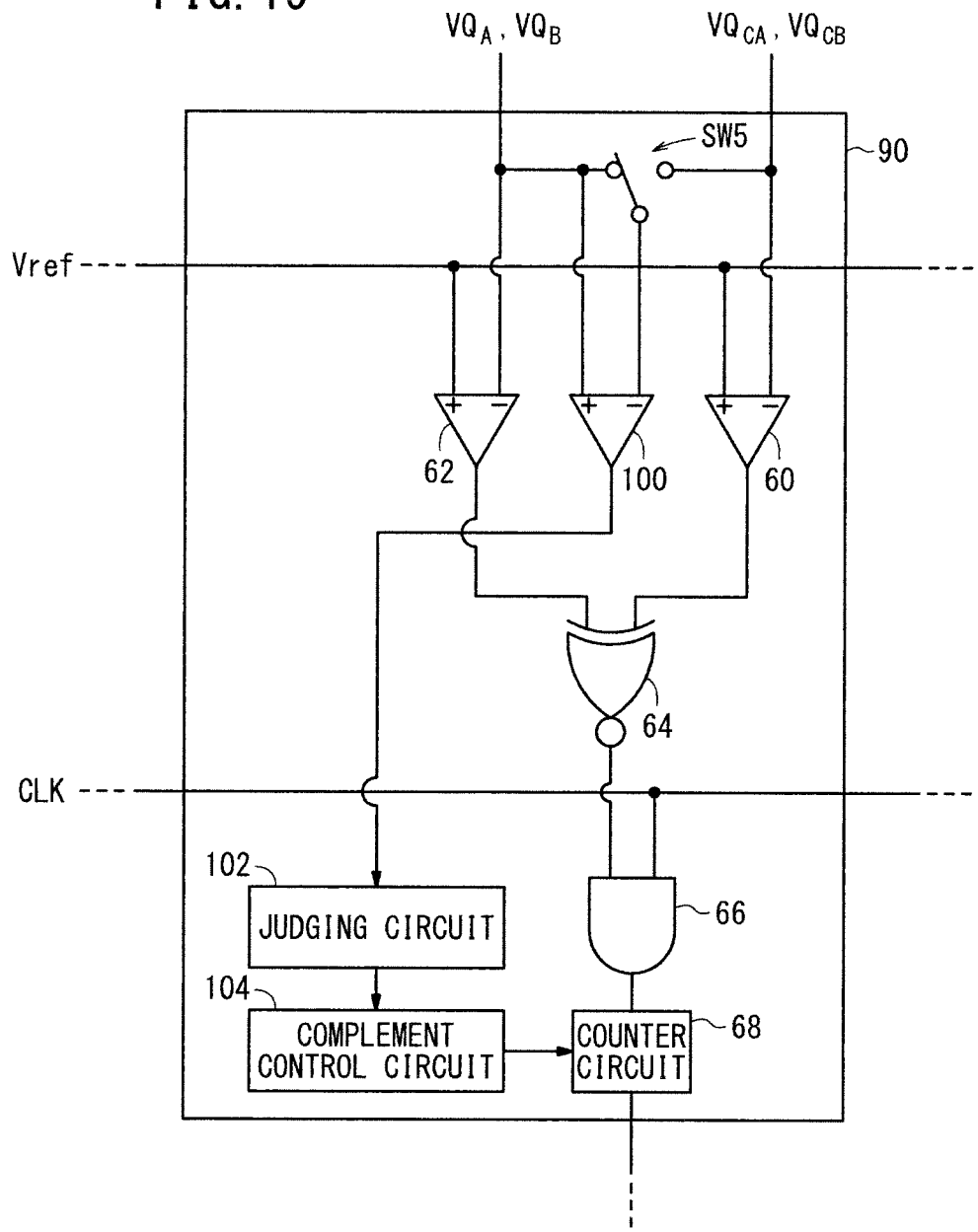
FIG. 19 is a block diagram of an arrangement of an AD converter according to a first modification.

According to modification 1, the solid-state image sensing device 30 includes an AD converter 90, as shown in FIG. 19, instead of the AD converter 36 shown in FIG. 8. Parts thereof, which have the same functions as those of the AD converter 36 shown in FIG. 8, are denoted by similar reference characters, and such features will not be described below. The AD converter 90 includes a third comparator 100, a judging circuit 102, and a complement control circuit 104, in addition to the first comparator 60, the second comparator 62, the differential circuit 64, the AND circuit 66, and the counter circuit 68.

The third comparator 100 compares the first analog signal $VQ_{CA}$ or $VQ_{CB}$, which is output from the first pixel 10a or 10b, with the second analog signal $VQ_A$ or $VQ_B$, which is output from the second pixel 10c or 10d. The second analog signal $VQ_A$ or $VQ_B$ is input to the positive terminal of the third comparator 100, whereas any one of the first analog signal $VQ_{CA}$ or $VQ_{CB}$ or the second analog signal $VQ_A$ or $VQ_B$ is input, through a switch SW5, to the negative terminal of the third comparator 100.

The third comparator 100 is of the same configuration as the first comparator 60. Before the third comparator 100 compares the first analog signal $VQ_{CA}$ or $VQ_{CB}$ with the second analog signal $VQ_A$ or $VQ_B$, the second analog signal $VQ_A$ or $VQ_B$ is input, through the switch SW5, to the negative terminal of the third comparator 100. In this case, the second analog signal $VQ_A$ or $VQ_B$ is input to the positive and negative terminals of the third comparator 100, whereupon the third comparator 100 is auto-zeroed. More specifically, the switch SW3 and the switch SW4 of the third comparator 100 are turned on. Thereafter, the first analog signal $VQ_{CA}$ or $VQ_{CB}$ is input, through the switch SW5, to the third comparator 100.

The third comparator 100 compares the first analog signal $VQ_{CA}$ or $VQ_{CB}$ with the second analog signal $VQ_A$ or $VQ_B$ at a first comparison timing after the black level counting period has finished and before a pixel charge transfer signal as been supplied to the pixel 10, and at a second comparison timing after the pixel charge transfer signal as been supplied to the pixel 10 and before the signal level counting period has started. If the second analog signal $VQ_A$ or $VQ_B$ is greater than the first analog signal $VQ_{CA}$ or $VQ_{CB}$, then the third comparator 100 outputs a high-level signal. If the second analog signal $VQ_A$ or $VQ_B$ is smaller than the first analog signal $VQ_{CA}$ or $VQ_{CB}$, then the third comparator 100 outputs a low-level signal. At the first comparison timing, the third comparator 100 compares the first analog signal $VQ_{CA}$ or $VQ_{CB}$ of the black level with the second analog signal $VQ_A$ or $VQ_B$ of the black level. At the second comparison timing, the third comparator 100 compares the first analog signal $VQ_{CA}$ or $VQ_{CB}$ of the signal level with the second analog signal $VQ_A$ or $VQ_B$ of the signal level.

The comparison result from the third comparator 100 is input to the judging circuit 102. The judging circuit 102 judges whether the count value should be converted into a 2's complement in one or both of a first complement conversion period after the black level counting period and before the signal level counting period, and a second complement conversion period after the signal level counting period, or whether the count value should not be converted into a 2's complement in both of such periods.

Based on the judgment result from the judging circuit 102, the complement control circuit 104 controls the control signal generating circuit 74 and the pulse generating circuit 76 in order to control execution or non-execution of the 2's complement conversion process of the counter circuit 68.

Figure 20:
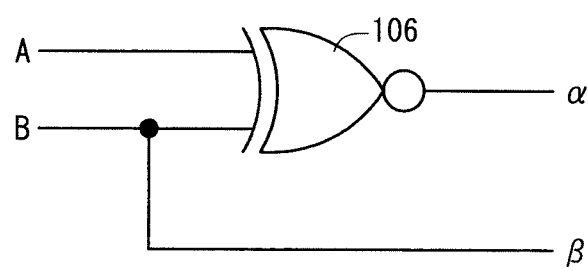
FIG. 20 is a block diagram of an arrangement of a judging circuit shown in FIG. 19.

FIG. 20 is a block diagram of an arrangement of the judging circuit 102. The judging circuit 102 includes an EXNOR circuit 106. A comparison result signal A, which is input to the EXNOR circuit 106, is a signal representative of the comparison result from the third comparator 100 at the first comparison timing. Also, a comparison result signal B, which is input to the EXNOR circuit 106, is a signal representative of the comparison result from the third comparator 100 at the second comparison timing. The judging circuit 102 outputs a judgment signal α based on the comparison result signal A and the comparison result signal B. The judging circuit 102 also outputs the comparison result signal B directly as a judgment signal β. The judgment signal α provides information indicative of whether or not the count value should be converted into a 2's complement in the first complement conversion period. The judgment signal β provides information indicative of whether or not the count value should be converted into a 2's complement in the second complement conversion period.

FIG. 21 is a diagram showing a truth table made up of the comparison result signals and the judgment signals. If both the comparison result signal A and the comparison result signal B are low-level signals, then the judgment signal α is a high-level signal and the judgment signal β is a low-level signal. If the comparison result signal A is a high-level signal and the comparison result signal B is a low-level signal, then both the judgment signal α and the judgment signal β are low-level signals. If the comparison result signal A is a low-level signal and the comparison result signal B is a high-level signal, then the judgment signal α is a low-level signal and the judgment signal β is a high-level signal. If both the comparison result signal A and the comparison result signal B are high-level signals, then both the judgment signal α and the judgment signal β are high-level signals.

If the judgment signal is a high-level signal, then the judgment signal indicates that the judging circuit 102 has judged that the count value should be converted into a 2's complement. If the inverted signal is a low-level signal, then the inverted signal indicates that the judging circuit 102 has judged that the count value should not be converted into a 2's complement.

An example of operations of the solid-state image sensing device 30 according to modification 1 will be described below with reference to the timing charts shown in FIGS. 22 through 25. In FIGS. 22 through 25, the difference between the second analog signal $VQ_A$ and the first analog signal $VQ_{CA}$ is determined and converted into a digital value. Conversion of the differential signal between the second analog signal $VQ_B$ and the first analog signal $VQ_{CB}$ is handled in the same manner as conversion of the differential signal between the second analog signal $VQ_A$ and the first analog signal $VQ_{CA}$, and this feature will not be described below.

When the first analog signal $VQ_{CA}$, which is of a black level, is read from the first pixel 10a through the vertical signal line 40, the first analog signal $VQ_{CA}$ is input to the negative terminal of the first comparator 60. When the second analog signal $VQ_A$, which is of a black level, is read from the second pixel 10c through the vertical signal line 38, the second analog signal $VQ_A$ is input to the negative terminal of the second comparator 62. According to modification 1, the level for auto-zeroing the first comparator 60 may be the same as the level for auto-zeroing the second comparator 62.

At the first comparison timing, after the first AD conversion period has finished and before a pixel charge transfer signal as been supplied to the pixel 10, the third comparator 100 compares the first analog signal $VQ_{CA}$ with the second analog signal $VQ_A$, and outputs a comparison result signal A representative of the comparison result to the judging circuit 102.

Figure 22:
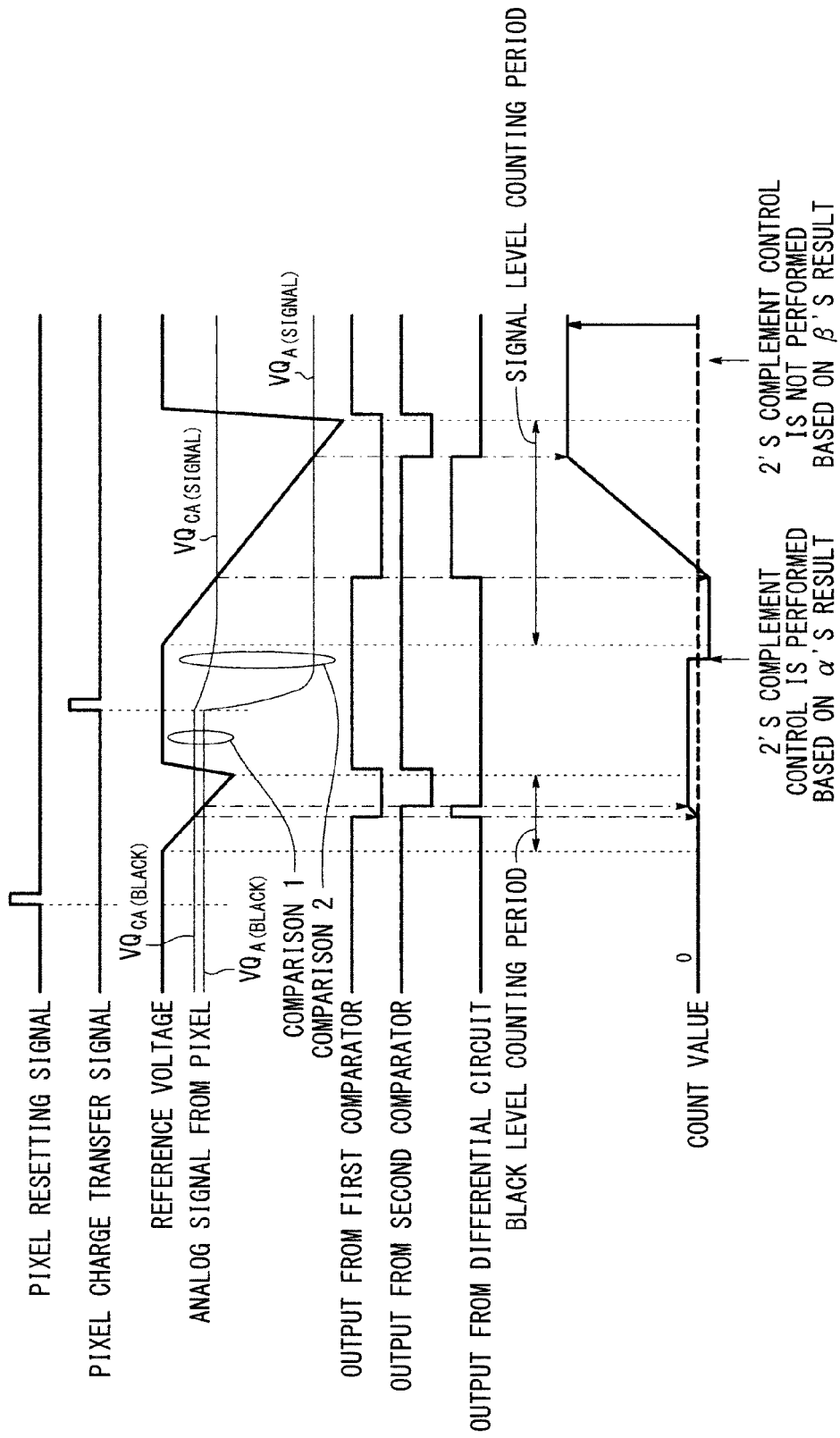
FIG. 22 is a timing chart of an example of operations of a solid-state image sensing device according to the first modification.

At the first comparison timing shown in FIG. 22, since the first analog signal $VQ_{CA}$ is greater than the second analog signal $VQ_A$, the third comparator 100 outputs a comparison result signal A, which is of a low level, to the judging circuit 102. At the first comparison timing shown in FIG. 23, since the first analog signal $VQ_{CA}$ is smaller than the second analog signal $VQ_A$, the third comparator 100 outputs a comparison result signal A, which is of a high level, to the judging circuit 102. At the first comparison timing shown in FIG. 24, since the first analog signal $VQ_{CA}$ is greater than the second analog signal $VQ_A$, the third comparator 100 outputs a comparison result signal A, which is of a low level, to the judging circuit 102. At the first comparison timing shown in FIG. 25, since the first analog signal $VQ_{CA}$ is smaller than the second analog signal $VQ_A$, the third comparator 100 outputs a comparison result signal A, which is of a high level, to the judging circuit 102.

At the second comparison timing, after the pixel charge transfer signal as been supplied to the pixel 10 and before the second AD conversion period has started, the third comparator 100 compares the first analog signal $VQ_{CA}$ with the second analog signal $VQ_A$, and outputs a comparison result signal B representative of the comparison result to the judging circuit 102.

At the second comparison timing shown in FIG. 22, since the first analog signal $VQ_{CA}$ is greater than the second analog signal $VQ_A$, the third comparator 100 outputs a comparison result signal B, which is of a low level, to the judging circuit 102. At the second comparison timing shown in FIG. 23, since the first analog signal $VQ_{CA}$ is greater than the second analog signal $VQ_A$, the third comparator 100 outputs a comparison result signal B, which is of a low level, to the judging circuit 102. At the second comparison timing shown in FIG. 24, since the first analog signal $VQ_{CA}$ is smaller than the second analog signal $VQ_A$, the third comparator 100 outputs a comparison result signal B, which is of a high level, to the judging circuit 102. At the second comparison timing shown in FIG. 25, since the first analog signal $VQ_{CA}$ is smaller than the second analog signal $VQ_A$, the third comparator 100 outputs a comparison result signal B, which is of a high level, to the judging circuit 102.

Based on the comparison result signal A and the comparison result signal B, the judging circuit 102 outputs a judgment signal $\alpha$ and a judgment signal $\beta$ to the complement control circuit 104. As shown in the truth table of FIG. 21, with respect to the timing chart shown in FIG. 22, since the comparison result signal A is of a low level and the comparison result signal B is of a low level, the judging circuit 102 outputs a judgment signal $\alpha$, which is of a high level, and a judgment signal $\beta$, which is of a low level, to the complement control circuit 104. With respect to the timing chart shown in FIG. 23, since the comparison result signal A is of a high level and the comparison result signal B is of a low level, the judging circuit 102 outputs a judgment signal $\alpha$, which is of a low level, and a judgment signal $\beta$, which is of a low level, to the complement control circuit 104. With respect to the timing chart shown in FIG. 24, since the comparison result signal A is of a low level and the comparison result signal B is of a high level, the judging circuit 102 outputs a judgment signal $\alpha$, which is of a low level, and a judgment signal $\beta$, which is of a high level, to the complement control circuit 104. With respect to the timing chart shown in FIG. 25, since the comparison result signal A is of a high level and the comparison result signal B is of a high level, the judging circuit 102 outputs a judgment signal $\alpha$, which is of a high level, and a judgment signal $\beta$, which is of a high level, to the complement control circuit 104.

Based on the judgment signals $\alpha$ and $\beta$, the complement control circuit 104 controls execution or non-execution of the 2's complement conversion process of the counter circuit 68. Based on the judgment signal $\alpha$, the complement control circuit 104 controls the control signal generating circuit 74 and the pulse generating circuit 76 of the counter circuit 68, so as to convert or not convert the count value into a 2's complement during the first complement conversion period. Based on the judgment signal $\beta$, the complement control circuit 104 controls the control signal generating circuit 74 and the pulse generating circuit 76 of the counter circuit 68, so as to convert or not convert the count value into a 2's complement during the second complement conversion period.

In FIG. 22, since the judgment signal $\alpha$ is of a high level, the complement control circuit 104 performs a control process for converting the count value into a 2's complement during the first complement conversion period. More specifically, during the first complement conversion period, the complement control circuit 104 controls the switch circuits 72 to change from state a, to state b, to state c, and back to state a. Thereafter, the complement control circuit 104 controls the pulse generating circuit 76 to generate a pulse, and inputs the pulse to the head switch circuit 72 in order to convert the count value into a 2's complement. When the first complement conversion period comes to an end, the second AD conversion period starts (i.e., a pulse train depending on the differential signal of the signal level is input from the AND circuit 66).

Since the judgment signal $\beta$ is of a low level, the complement control circuit 104 does not perform a control process for converting the count value into a 2's complement during the second complement conversion period. More specifically, during the second complement conversion period, the complement control circuit 104 controls the switch circuits 72 in order to keep the switch circuits 72 in state a, and controls the pulse generating circuit 76 or the output signal from the pulse generating circuit 76, so as to inhibit a pulse from being generated. In this manner, a digital value representing the incident light energy $Q_A$ minus (−) the incident light energy $Q_{CA}$, and the incident light energy $Q_B$, minus (−) the incident light energy $Q_{CB}$ is produced.

Figure 23:
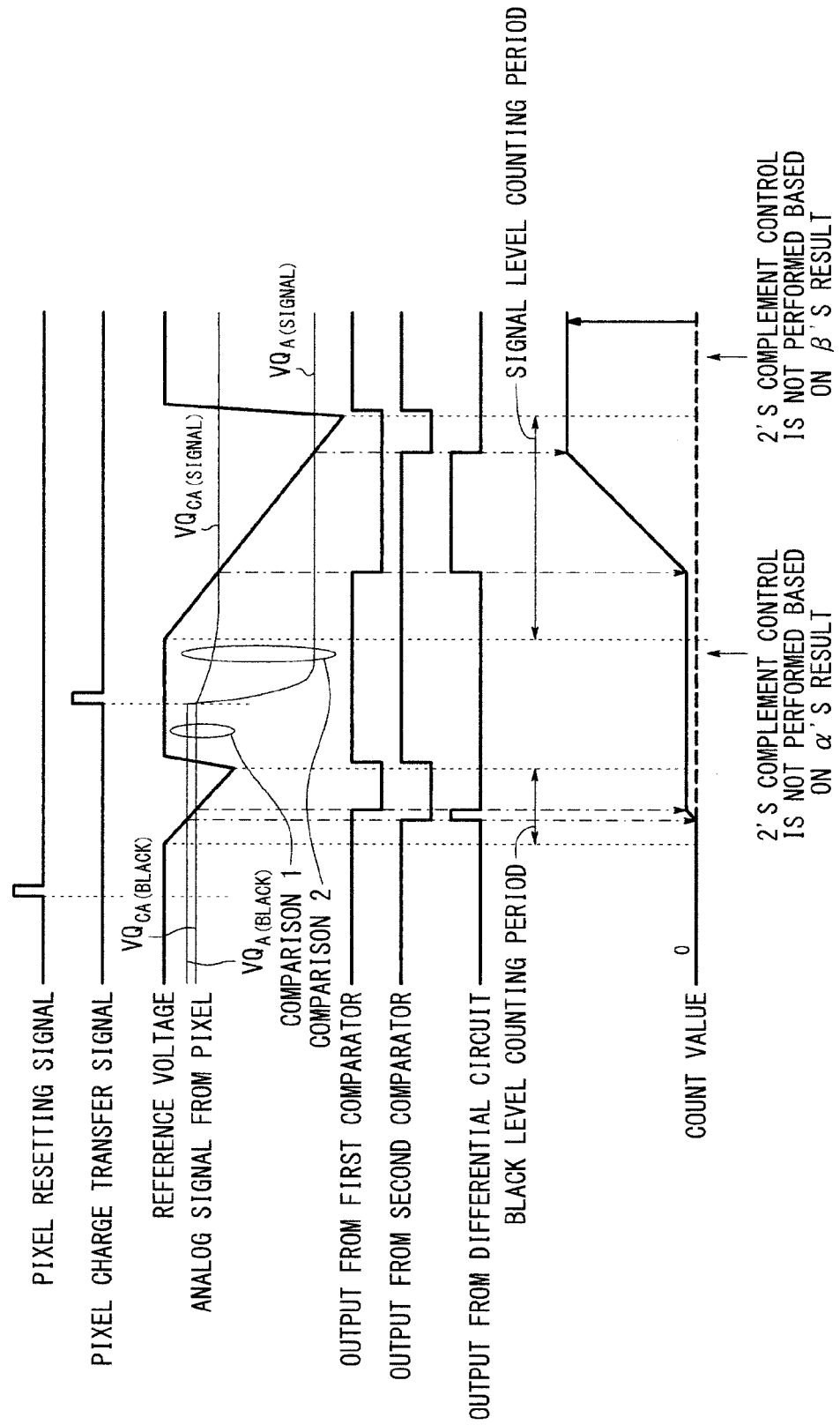
FIG. 23 is a timing chart of an example of operations of the solid-state image sensing device according to the first modification.

In FIG. 23, since the judgment signals $\alpha$ and $\beta$ are of a low level, the complement control circuit 104 does not perform a control process for converting the count value into a 2's complement during the first complement conversion period and the second complement conversion period. More specifically, during the first complement conversion period and the second complement conversion period, the complement control circuit 104 controls the switch circuits 72 in order to keep the switch circuits 72 in state a, and controls the pulse generating circuit 76 or the output signal from the pulse generating circuit 76, so as to inhibit a pulse from being generated. In this manner, digital values representing the incident light energy $Q_A$ minus (−) the incident light energy $Q_{CA}$, and the incident light energy $Q_B$, minus (−) the incident light energy $Q_{CB}$ are produced.

Figure 24:
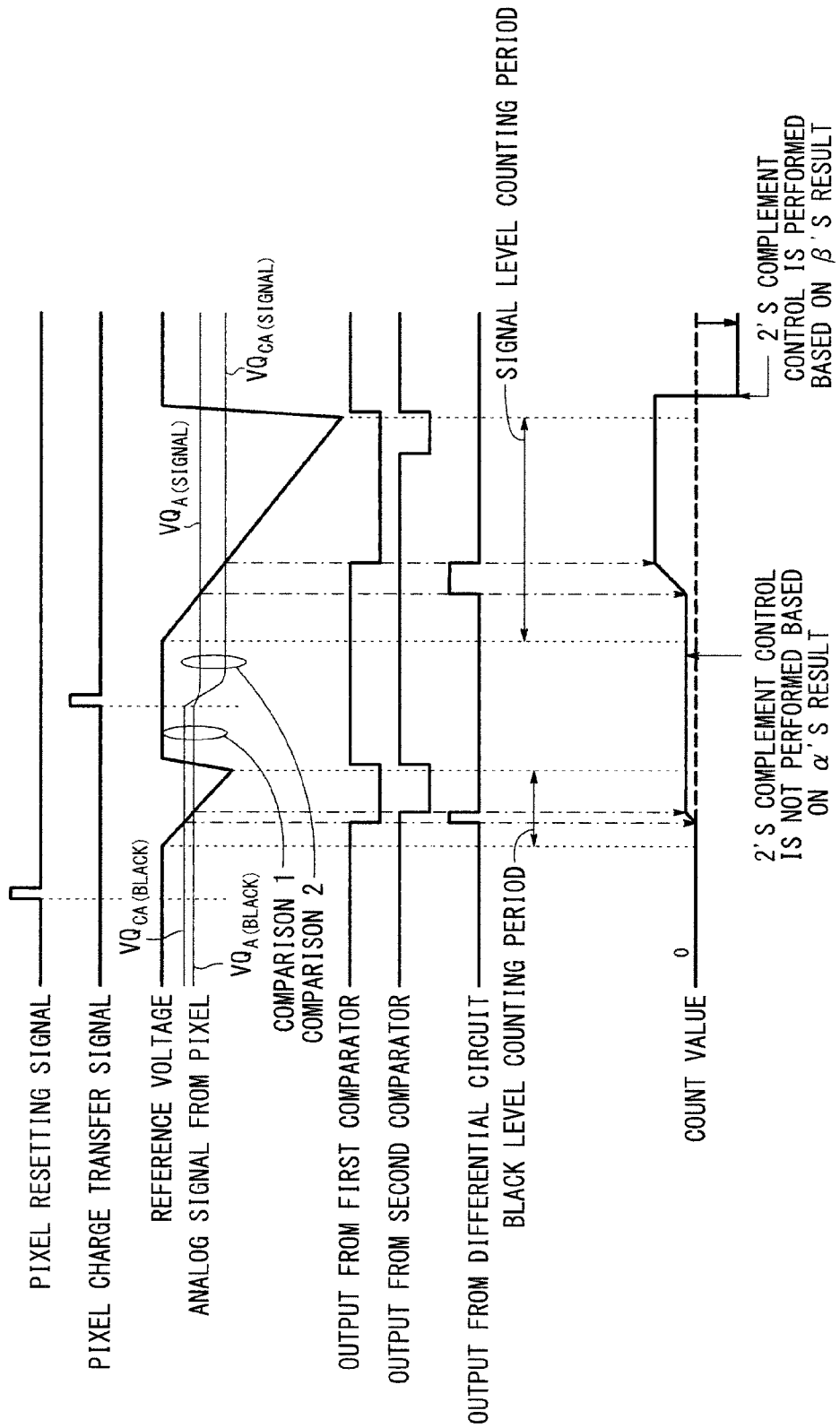
FIG. 24 is a timing chart of an example of operations of the solid-state image sensing device according to the first modification.

In FIG. 24, since the judgment signal α is of a low level, the complement control circuit 104 does not perform a control process for converting the count value into a 2's complement during the first complement conversion period. More specifically, during the first complement conversion period, the complement control circuit 104 controls the switch circuits 72 in order to keep the switch circuits 72 in state a, and controls the pulse generating circuit 76 in order to inhibit a pulse from being generated.

Since the judgment signal β is of a high level, the complement control circuit 104 performs a control process for converting the count value into a 2's complement during the second complement conversion period. More specifically, during the second complement conversion period, the complement control circuit 104 controls the switch circuits 72 to change from state a, to state b, to state c, and back to state a. Thereafter, the complement control circuit 104 controls the pulse generating circuit 76 to generate a pulse, and inputs the pulse to the head switch circuit 72 in order to convert the count value into a 2's complement. In this manner, digital values representing the incident light energy $Q_A$ minus (−) the incident light energy $Q_{CA}$, and the incident light energy $Q_B$ minus (−) the incident light energy $Q_{CB}$ are produced.

Figure 25:
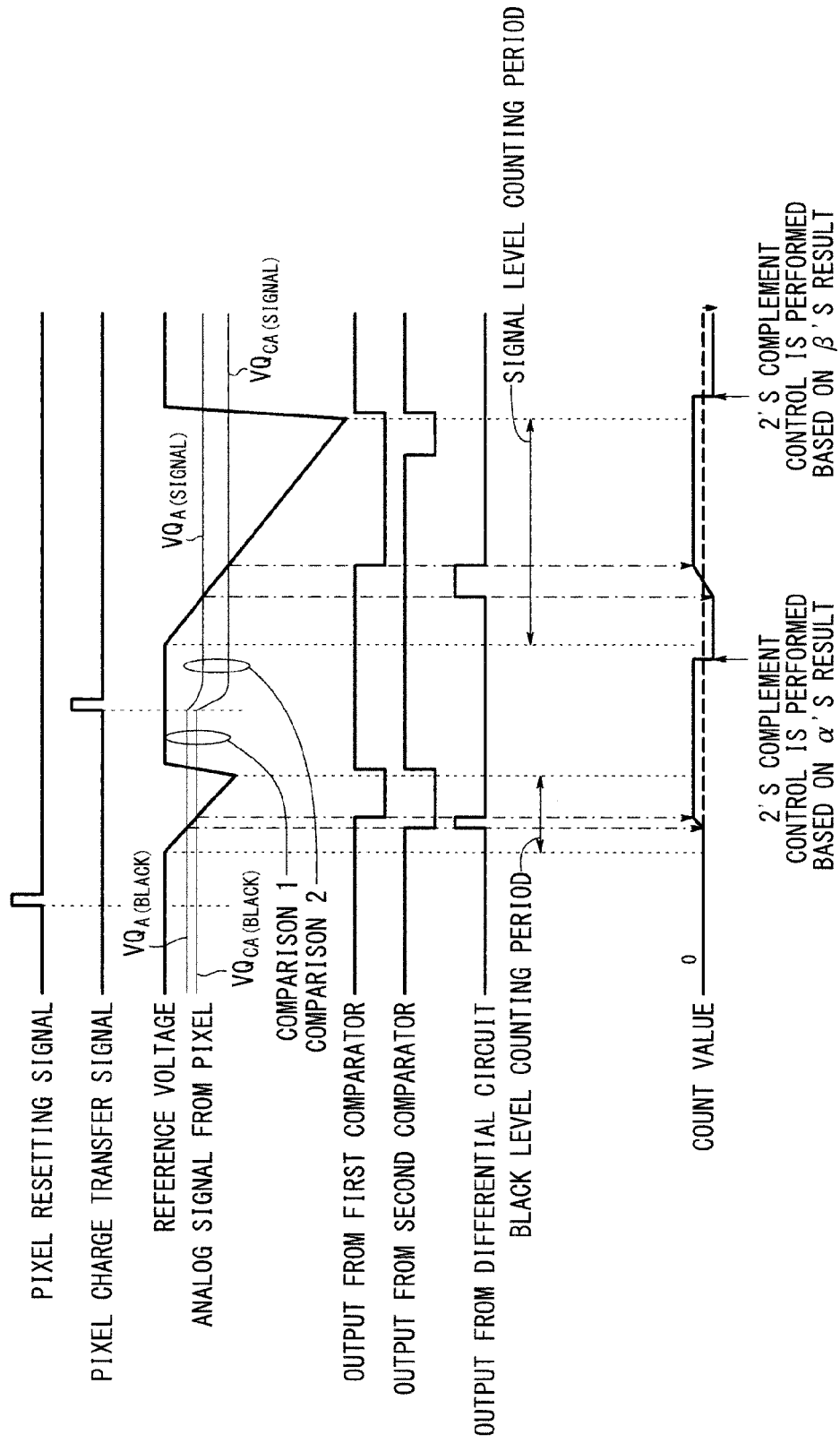
FIG. 25 is a timing chart of an example of operations of the solid-state image sensing device according to the first modification.
Figure 26:
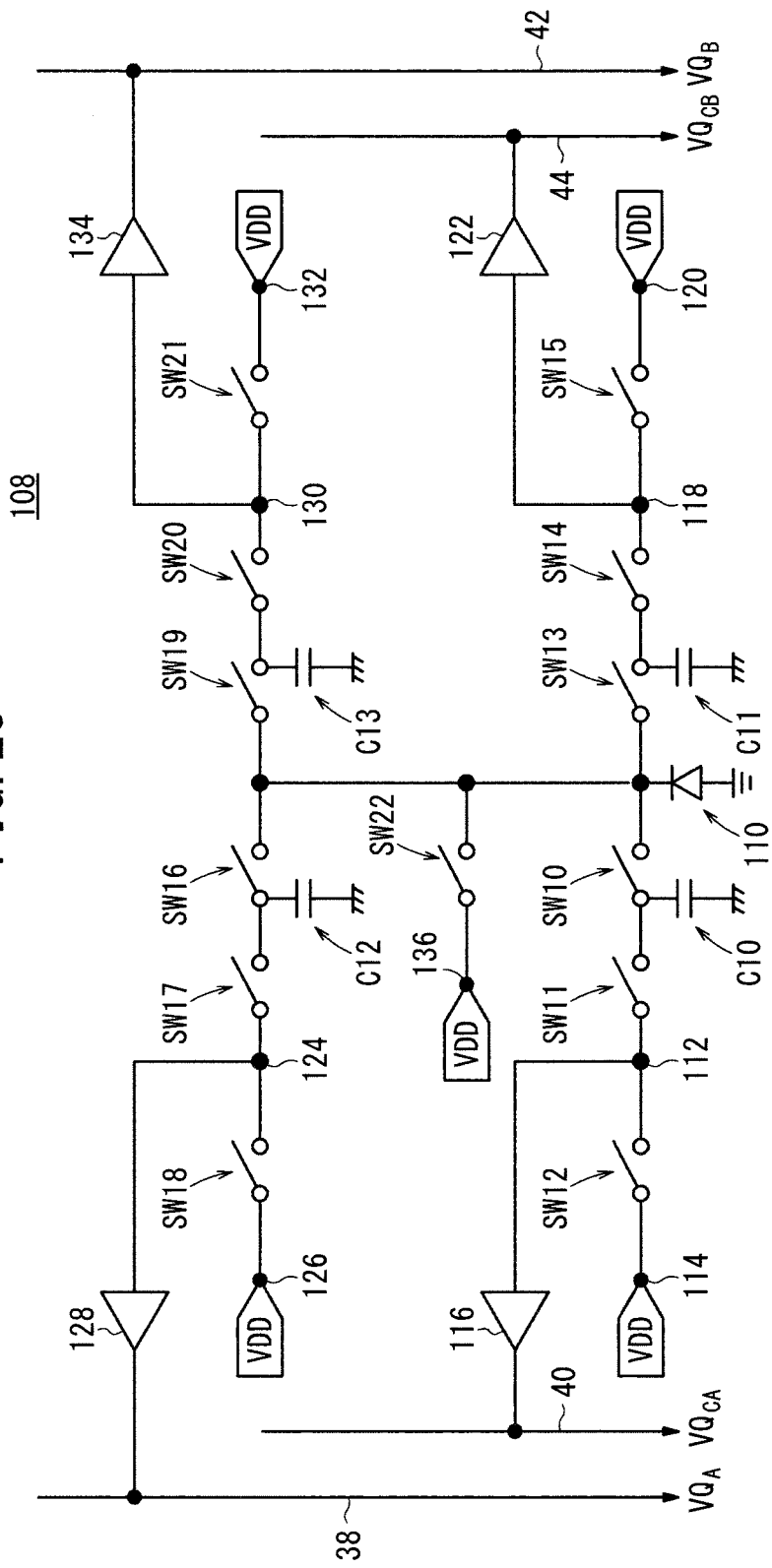
FIG. 26 is a diagram showing an arrangement of a pixel according to a second modification.

In FIG. 25, since the judgment signals α, β are high in level, the complement control circuit 104 performs a control process for converting the count value into a 2's complement during the first complement conversion period and during the second complement conversion period. More specifically, during the first complement conversion period and the second complement conversion period, the complement control circuit 104 controls the switch circuits 72 in order to change from state a, to state b, to state c, and back to state a. Thereafter, the complement control circuit 104 controls the pulse generating circuit 76 in order to generate a pulse, whereupon the pulse is input to the head switch circuit 72 in order to convert the count value into a 2's complement. In this manner, digital values representing the incident light energy $Q_A$ minus (−) the incident light energy $Q_{CA}$, and the incident light energy $Q_B$ minus (−) the incident light energy $Q_{CB}$ are produced.

As described above, at the first comparison timing, the second analog signals $VQ_A$, $VQ_B$ of the black level and the first analog signals $VQ_{CA}$, $VQ_{CB}$ of the black level are compared with each other, and at the second comparison timing, the second analog signals $VQ_A$, $VQ_B$ of the signal level and the first analog signals $VQ_{CA}$, $VQ_{CB}$ of the black level are compared with each other, so as to judge whether or not the count value should be converted into a 2's complement during the first complement conversion period, and also to judge whether or not the count value should be converted into a 2's complement during the second complement conversion period. Thereafter, based on the judgment results, execution or non-execution of the 2's complement conversion process is controlled during the first and second complement conversion periods.

Consequently, even if the second analog signals $VQ_A$, $VQ_B$ of the black level are higher in level than the first analog signals $VQ_{CA}$, $VQ_{CB}$ of the black level, or if the second analog signals $VQ_A$, $VQ_B$ of the signal level are higher in level than the first analog signals $VQ_{CA}$, $VQ_{CB}$ of the black level, it is possible to produce a signal value representing the incident light energy $Q_A$ minus (−) the incident light energy $Q_{CA}$, or the incident light energy $Q_B$ minus (−) the incident light energy $Q_{CB}$. As shown in FIGS. 24 and 25, the pulses can be counted even if the count value (digital value) produced by the counter circuit 68 is negative. Inasmuch as the AD converter 90 subtracts the analog signal representing the incident light energy $Q_{CA}$ or $Q_{CB}$ from the analog signal representing the incident light energy $Q_A$ or $Q_B$, it is possible to produce digital values representing the incident light energy $Q_A$ minus (−) the incident light energy $Q_{CA}$, and the incident light energy $Q_B$ minus (−) the incident light energy $Q_{CB}$. Thus, modification 1 offers the same advantages as the above-described embodiment.

(Modification 2)

In the above embodiment, the first analog signals $VQ_{CA}$, $VQ_{CB}$ and the second analog signals $VQ_A$, $VQ_B$ are obtained from different first pixels 10a, 10b and different second pixels 10c, 10d, respectively. According to modification 2, however, the first analog signals $VQ_{CA}$, $VQ_{CB}$ and the second analog signals $VQ_A$, $VQ_B$ are obtained from one pixel.

According to modification 2, a unit pixel (hereinafter referred to simply as a pixel) 108 is used instead of the pixel 10 shown in FIGS. 2 through 7. The pixel 108 comprises a photodetector 110, capacitors C10 through C13, switching elements SW10 through SW22, an FD 112, a photoelectron discharger 114, a pixel amplifier 116, an FD 118, a photoelectron discharger 120, a pixel amplifier 122, an FD 124, a photoelectron discharger 126, a pixel amplifier 128, an FD 130, a photoelectron discharger 132, and a pixel amplifier 134.

The capacitors C10 through C13 are connected respectively to the photodetector 110 through the switches SW10, SW13, SW16, SW19. When any one of the switches SW10, SW13, SW16, SW19 is turned on, a photoelectron stored in the photodetector 110 is transferred to one of the capacitors C10 through C13. For example, when the switch SW16 is turned on, a photoelectron, which is generated by photoelectric conversion by the photodetector 110, is transferred to and stored in the capacitor C12. A photoelectron generated by the photodetector 110 in the first exposure period and during the first occurrence thereof is transferred to the capacitor C11, and a photoelectron stored in the photodetector 110 in the first exposure period and during the second occurrence thereof is transferred to the capacitor C10. The capacitor C10 and the capacitor C11 function respectively as first photoelectron storage units. A photoelectron stored in the photodetector 110 in a second exposure period and during the first occurrence thereof (a period in which an emitted light reflected from the subject, which is illuminated by the illuminating unit, and an ambient light are detected for a predetermined time while the subject is illuminated by the illuminating unit) is transferred to the capacitor C13, and a photoelectron stored in the photodetector 110 in the second exposure period and during the second occurrence thereof (a period in which light is detected for a predetermined time after the illuminating unit has stopped illuminating the subject) is transferred to the capacitor C12. The capacitor C12 and the capacitor C13 function respectively as second photoelectron storage units. The capacitors C10 through C13 may store photoelectrons, which have been generated by photoelectric conversion in one or more exposure periods.

The FDs 112, 118, 124, 130 are connected respectively to each of the capacitors C10 through C13 through the switches SW11, SW14, SW17, SW20. When the switches SW11, SW14, SW17, SW20 are turned on, photoelectrons that are present in the capacitors C10 through C13 are transferred to the FDs 112, 118, 124, 130. The switches SW11, SW14, SW17, SW20 are selectively turned on and off when the switches SW11, SW14, SW17, SW20 are supplied with pixel charge transfer signals.

The FDs 112, 118, 124, 130 are connected respectively to each of the photoelectron dischargers 114, 120, 126, 132 through the switches SW12, SW15, SW18, SW21. When the switches SW12, SW15, SW18, SW21 are turned on, photoelectrons that are present in the FDs 112, 118, 124, 130 are discharged through the photoelectron dischargers 114, 120, 126, 132. The photoelectron dischargers 114, 120, 126, 132 are supplied with a positive power supply voltage VDD from a non-illustrated power supply. The switches SW12, SW15, SW18, SW21 are selectively turned on and off when the switches SW12, SW15, SW18, SW21 are supplied with pixel resetting signals.

The pixel amplifiers 116, 122, 128, 134 amplify the respective voltages of the FDs 112, 118, 124, 130. A vertical signal line 38, to which the second analog signals $VQ_A$ from the pixel amplifier 128 are output, is connected to the pixel amplifier 128. A vertical signal line 40, to which the first analog signals $VQ_{CA}$ from the pixel amplifier 116 are output, is connected to the pixel amplifier 116. A vertical signal line 42, to which the second analog signals $VQ_B$ from the pixel amplifier 134 are output, is connected to the pixel amplifier 134. A vertical signal line 44, to which the first analog signals $VQ_{CB}$ from the pixel amplifier 122 are output, is connected to the pixel amplifier 122.

The pixel 108 detects the light shown in FIG. 1, whereby photoelectrons stored in the photodetector 110 in respective exposure periods are transferred to the capacitors C10 through C13. Thereafter, the switches SW12, SW15, SW18, SW21 are supplied with pixel resetting signals of a high level, so as to allow the photoelectrons, which are present in the FDs 112, 118, 124, 130, to be discharged through the photoelectron dischargers 114, 120, 126, 132, and thereafter, the switches SW12, SW15, SW18, SW21 are supplied with pixel resetting signals of a low level. At this time, the second analog signal $VQ_A$ of the black level, the first analog signal $VQ_{CA}$ of the black level, the second analog signal $VQ_B$ of the black level, and the first analog signal $VQ_{CB}$ of the black level are read respectively from the vertical signal lines 38, 40, 42, 44.

Thereafter, the switches SW11, SW14, SW17, SW20 are supplied with pixel charge transfer signals of a high level, so as to transfer the photoelectrons present in the capacitors C10 through C13, and thereafter, the switches SW11, SW14, SW17, SW20 are supplied with pixel charge transfer signals of a low level. At this time, the second analog signal $VQ_A$ of the signal level, the first analog signal $VQ_{CA}$ of the signal level, the second analog signal $VQ_B$ of the signal level, and the first analog signal $VQ_{CB}$ of the signal level are read respectively from the vertical signal lines 38, 40, 42, 44.

In the above embodiment, the pixel array 32 comprises an array of pixels 10, each of which includes a single photodetector 12 and a single photoelectron storage unit. According to modification 2, however, the pixel array 32 comprises an array of pixels 108, each of which includes a single photodetector 110 and a plurality of photoelectron storage units (capacitors C10 through C13).

Figure 27:
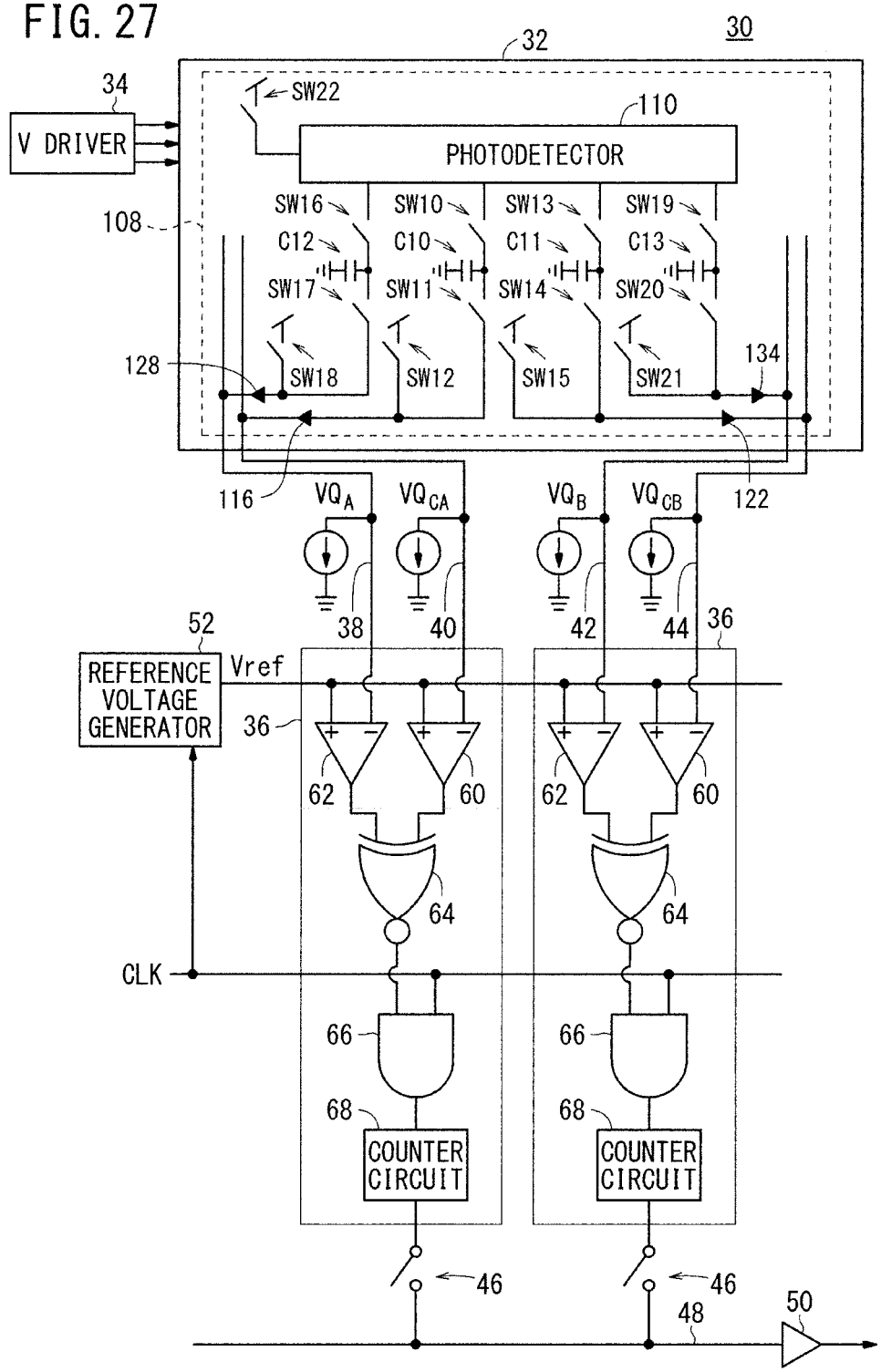
FIG. 27 is a diagram showing an arrangement of a solid-state image sensing device according to the second modification.

FIG. 27 is a diagram showing an arrangement of a solid-state image sensing device according to modification 2. As shown in FIG. 27, each of the pixels 108 of the pixel array 32 of the solid-state image sensing device 30 includes a single photodetector 110, and a plurality of photoelectron storage units. In FIG. 27, for illustrative purposes, only one pixel 108 is shown as being included in the pixel array 32. However, the pixel array 32 may include an array of pixels 108.

A photoelectron discharger 136 is connected to the photodetector 110 through a switch SW22. The photoelectron discharger 136 is supplied with a positive power supply voltage VDD from a non-illustrated power supply. When the switch SW22 is turned on, the photoelectron, which is present in the photodetector 110, is drained.

(Modification 3)

Figure 28:
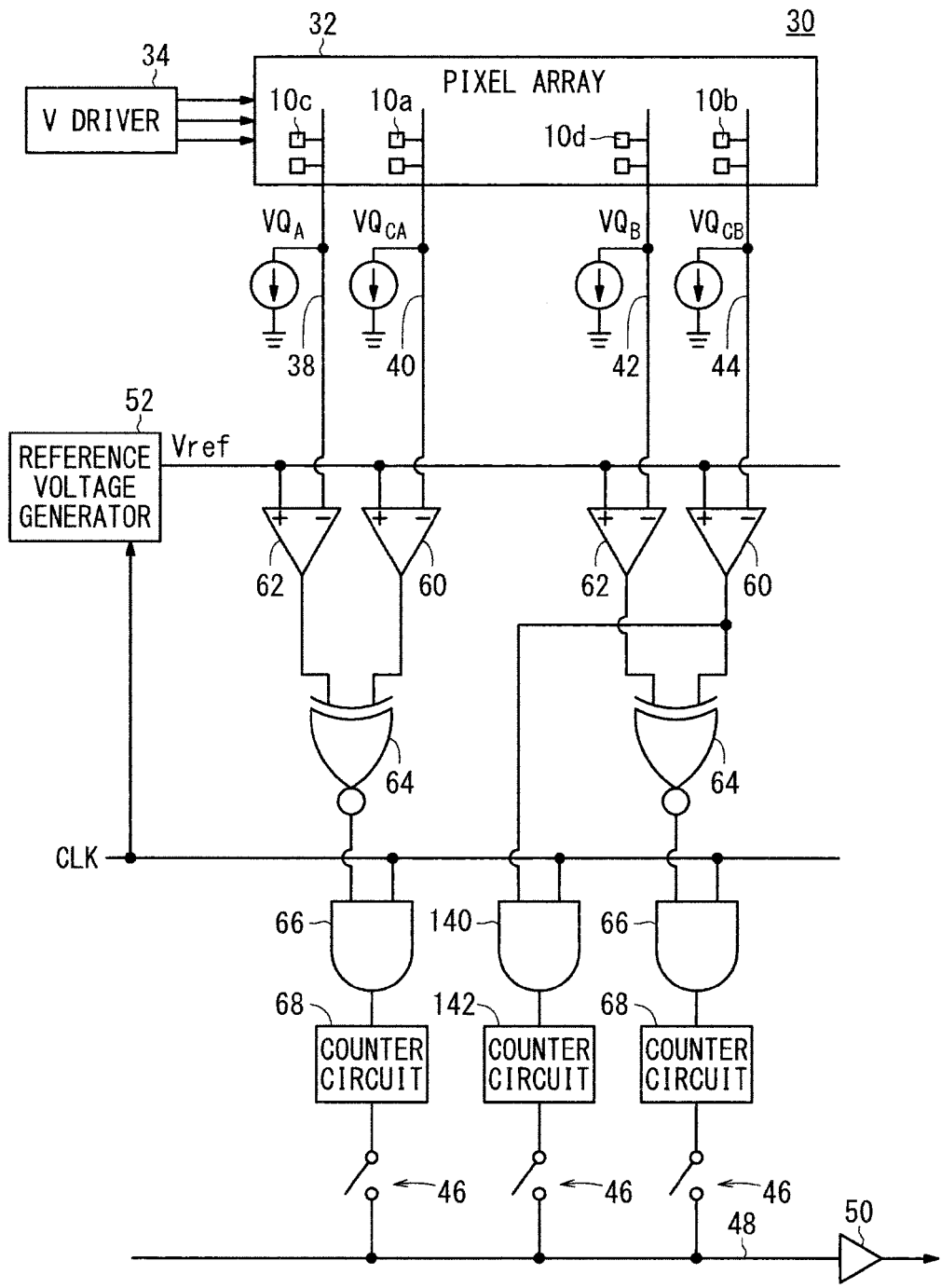
FIG. 28 is a diagram showing an arrangement of a solid-state image sensing device according to a third modification.

FIG. 28 is a diagram showing an arrangement of a solid-state image sensing device 30 according to a third modification. Parts thereof, which have the same functions as those shown in FIG. 8, are denoted by identical reference characters. According to modification 3, an AND circuit 140 and a counter circuit (second counter circuit) 142 are added to the solid-state image sensing device 30 shown in FIG. 8. The AND circuit 140 has the same function as the AND circuit 66, and the counter circuit 142 has the same function as the counter circuit 68, i.e., to convert the count value into a 2's complement. A signal that depends on the first analog signal $VQ_{CB}$ output from the first comparator 60 is input to the differential circuit 64 and to the additional AND circuit 140. A clock signal also is input to the AND circuit 140. The additional AND circuit 140 outputs a pulse train to the counter circuit 142, which depends on the first analog signal $VQ_{CB}$ output from the first comparator 60. The counter circuit 142 counts pulses of the pulse train depending on the first analog signal $VQ_{CB}$, and converts the first analog signal $VQ_{CB}$ into a digital signal. When the counter circuit 142 counts up pulses of a pulse train depending on the first analog signal $VQ_{CB}$, which is of the black level, the counter circuit 142 converts the count value into a 2's complement, and then counts up pulses of a pulse train depending on the first analog signal $VQ_{CB}$, which is of the signal level. Thus, the solid-state image sensing device 30 is capable of producing an image representing only ambient light.

Figure 29:
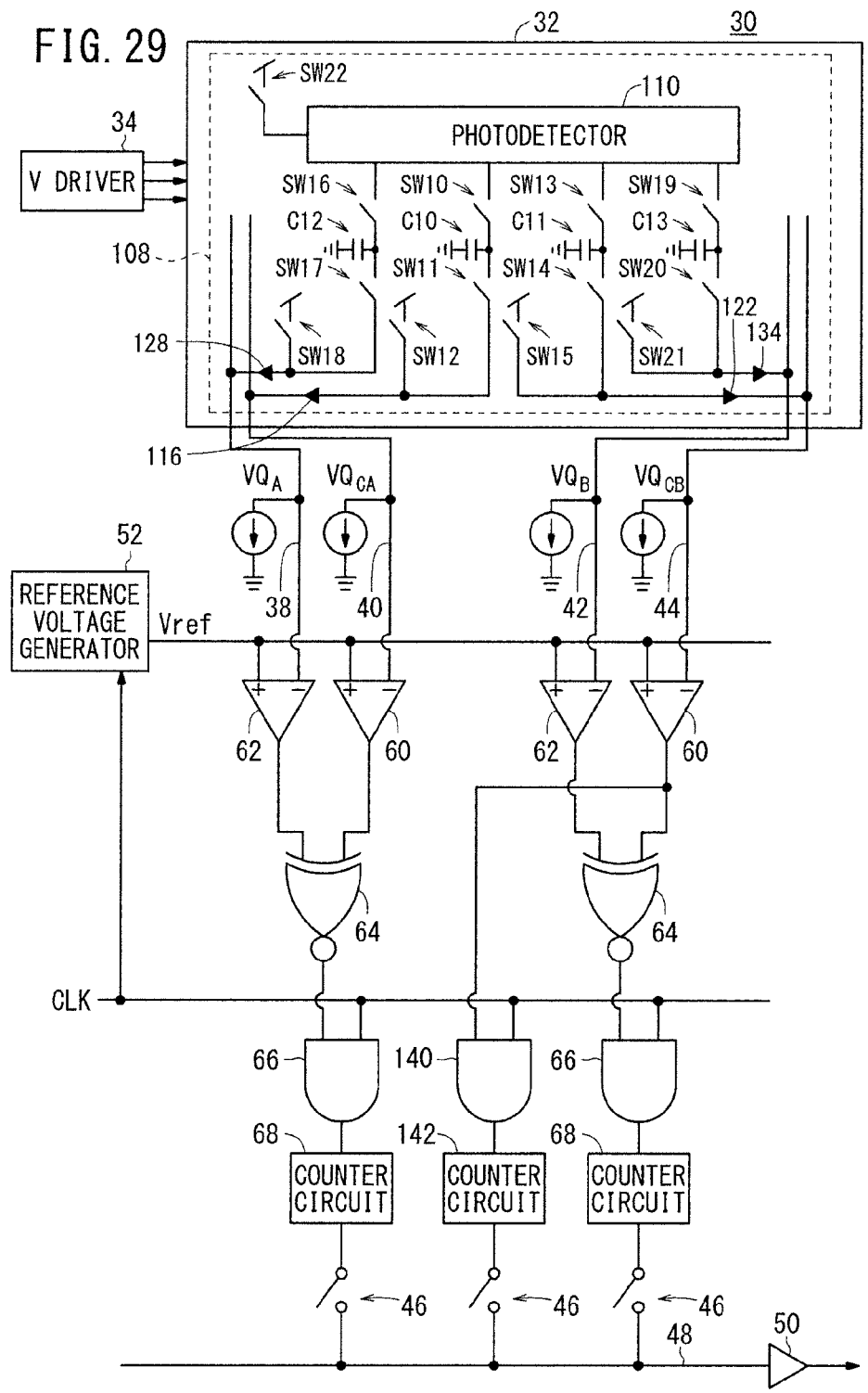
FIG. 29 is a diagram showing another arrangement of the solid-state image sensing device according to the third modification.

Similar to modification 2, the pixel array 32 shown in FIG. 28 may comprise an array of pixels 108, each of which includes a single photodetector 110 and a plurality of photoelectron storage units (capacitors C10 through C13). As shown in FIG. 29, each of the pixels 108 of the pixel array 32 has a single photodetector 110 and a plurality of photoelectron storage units. In FIG. 29, for illustrative purposes, only one pixel 108 is shown as being included in the pixel array 32. However, the pixel array 32 actually includes an array of pixels 108.

(Modification 4)

Figure 30:
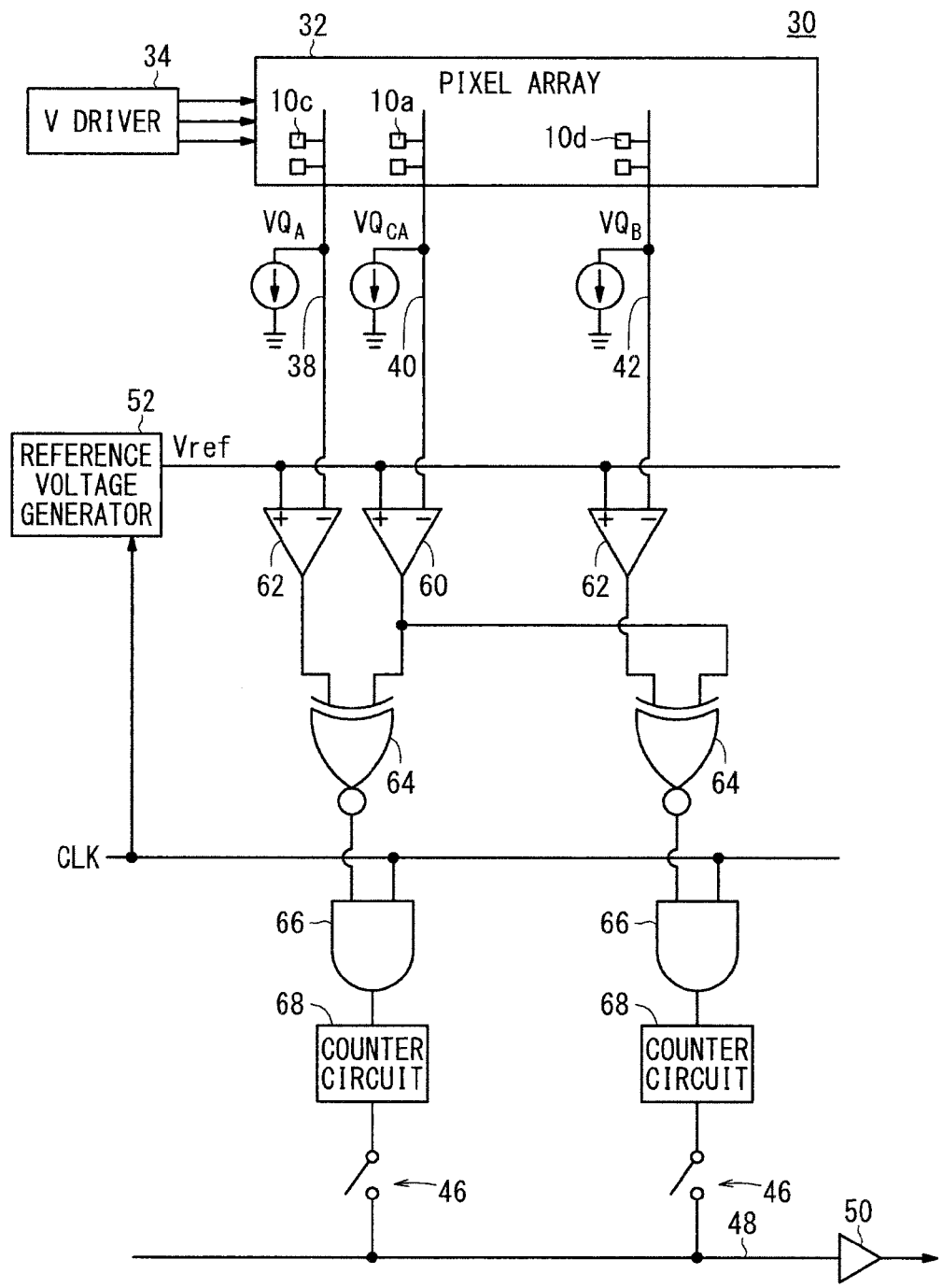
FIG. 30 is a diagram showing an arrangement of a solid-state image sensing device according to a fourth modification.

FIG. 30 is a diagram showing an arrangement of a solid-state image sensing device 30 according to a fourth modification. Parts thereof, which have the same functions as the parts shown in FIG. 8, are denoted by identical reference characters. Modification 4 differs from the solid-state image sensing device 30 shown in FIG. 8, in that modification 4 does not contain the first pixel 10b, the vertical signal line 44 for reading the first analog signal $VQ_{CB}$ from the first pixel 10b, or the first comparator 60 connected to the vertical signal line 44. Since the first analog signal $VQ_{CA}$ and the first analog signal $VQ_{CB}$ possess the same characteristics, the first analog signal $VQ_{CA}$, which is produced by the first pixel 10a, also is output to the differential circuit 64. The reduced number of photoelectron storage units shown in FIG. 30 thus provides the same function as the solid-state image sensing device 30, so that the pixels can be more highly integrated.

Figure 31:
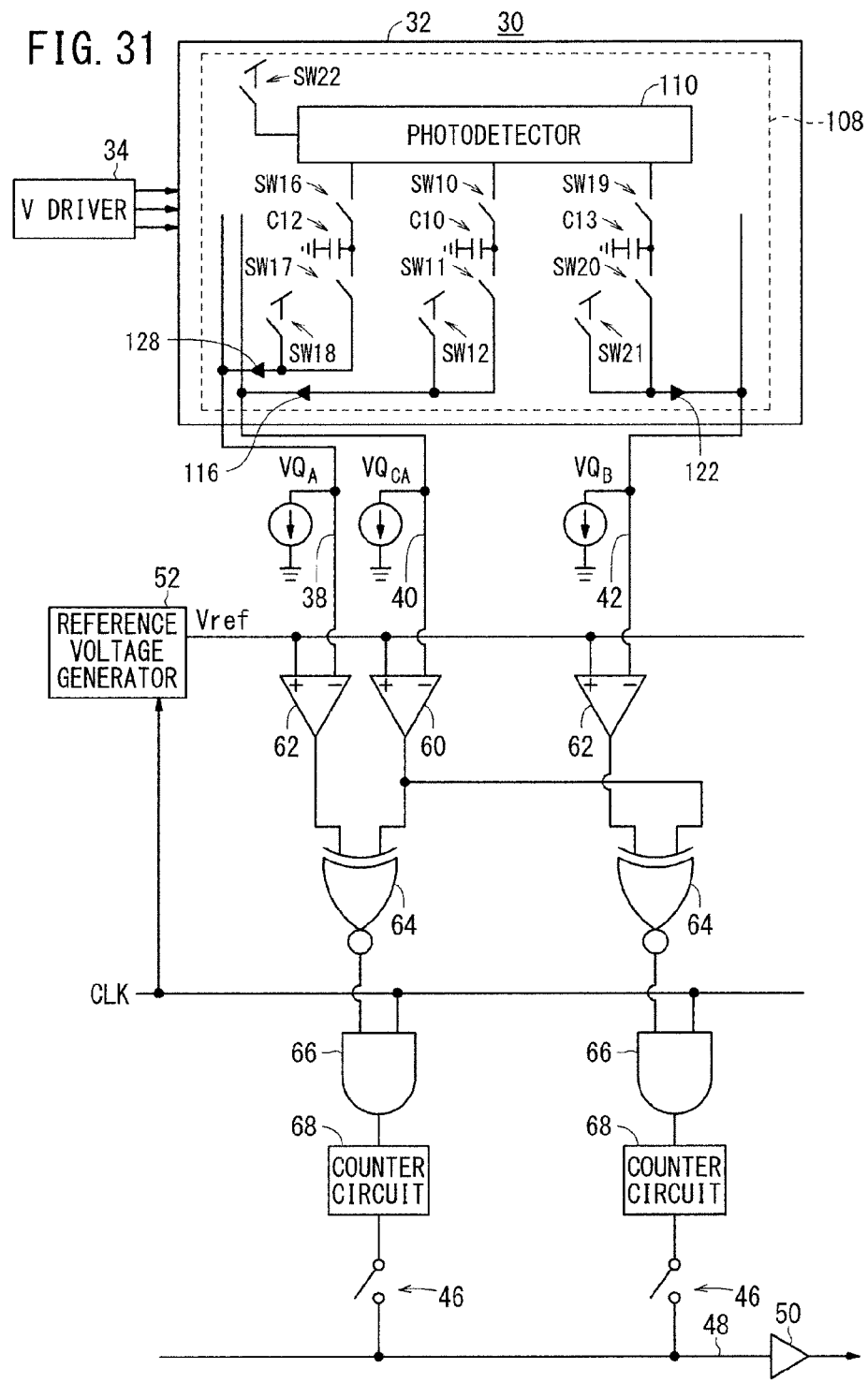
FIG. 31 is a diagram showing another arrangement of the solid-state image sensing device according to the fourth modification.
Figure 32:
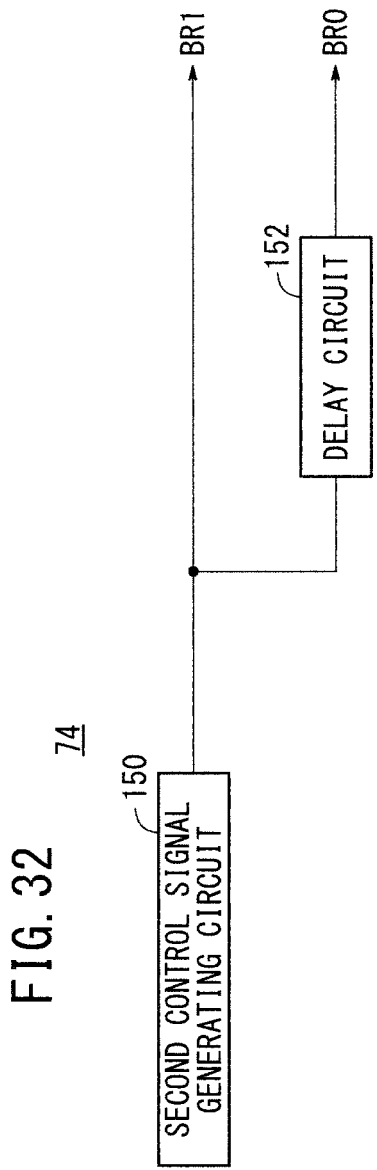
FIG. 32 is a circuit diagram of a control signal generating circuit shown in FIG. 9.

Similar to modification 2, the pixel array 32 shown in FIG. 30 may comprise an array of pixels 108, each of which includes a single photodetector 110 and a plurality of photoelectron storage units (capacitors C10, C12, C13). As shown in FIG. 31, each of the pixels 108 of the pixel array 32 includes a single photodetector 110, and a plurality of photoelectron storage units. In FIG. 32, for illustrative purposes, only one pixel 108 is shown as being included in the pixel array 32. However, the pixel array 32 actually includes an array of pixels 108.

(Modification 5)

The control signal generating circuit 74 may function to generate the first control signal BR0 from the second control signal BR1. FIG. 32 is a circuit diagram of the control signal generating circuit 74. The control signal generating circuit 74 includes a second control signal generating circuit 150 and a delay circuit 152. The second control signal generating circuit 150 generates the second control signal BR1. The second control signal BR1, which is generated by the second control signal generating circuit 150, is input to the delay circuit 152. The delay circuit 152 delays the second control signal BR1 input thereto by a prescribed time. The delayed signal makes up the first control signal BR0. The control signal generating circuit 74 outputs the second control signal BR1, which is generated by the second control signal generating circuit 150, together with the signal that is output from the delay circuit 152, i.e., the first control signal BR0. Thus, the circuitry of the sequencer may be reduced in size, since it is not necessary for the sequencer to generate two control signals.

Figure 33:
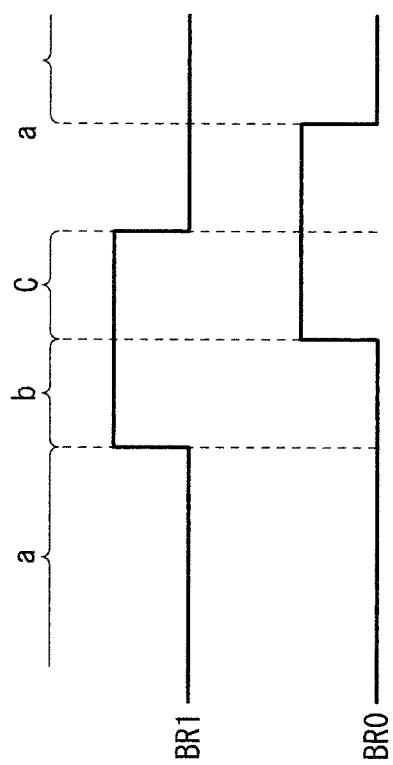
FIG. 33 is a diagram showing waveforms of a first control signal BR0 and a second control signal BR1, which are output from the control signal generating circuit shown in FIG. 32.

FIG. 33 is a diagram showing waveforms of the first control signal BR0 and the second control signal BR1, which are output from the control signal generating circuit 74 shown in FIG. 32. As shown in FIG. 33, the waveform of the first control signal BR0 is delayed from the waveform of the second control signal BR1 by a prescribed time. As described above, when the first control signal BR0 and the second control signal BR1 are both of a low level, the first and second control signals BR0, BR1 are placed in the state a. When the first control signal BR0 is of a low level and the second control signal BR1 is of a high level, the first and second control signals BR0, BR1 are placed in the state b. When the first control signal BR0 and the second control signal BR1 are both of a high level, the first and second control signals BR0, BR1 are placed in the state c.

(Modification 6)

In the above embodiment and in modifications 1 through 5, the photoelectron storage units output both the black level and the signal level to the vertical signal line. However, the photoelectron storage units may output only the signal level in order to provide an increased A/D conversion rate (=an increased frame rate of the solid-state image sensing device). More specifically, the photoelectron storage units may output only the signal level to the vertical signal line, and either one of the AD converters 36 or 90 may output digital values, which are representative of differences between the signal levels output from the different photoelectron storage units. In this case, variations in the characteristics of the pixels and the photoelectron storage units tend to affect the signals. However, if such variations occur in fixed patterns, then the variations can be measured in advance, so as to generate conversion tables for the respective pixels and the respective photoelectron storage units, thereby enabling the data produced by AD conversion to be corrected.

(Modification 7)

In the above embodiment and in modifications 1 through 6, the control signal generating circuit 74 and the pulse generating circuit 76 are disposed respectively in each of the counter circuits 68. However, the control signal generating circuit 74 and the pulse generating circuit 76 may be disposed outside of each of the counter circuits 68. In this manner, a single control signal generating circuit 74 and a single pulse generating circuit 76 may output a switch circuit control signal BR and one pulse to the counter circuits 68. In other words, a single control signal generating circuit 74 and a single pulse generating circuit 76 may convert the count values of the counter circuits 68 into 2's complements, respectively.

(Modification 8)

The above modifications 1 through 7 may be combined together in any of various desired combinations. The solid-state image sensing devices 30 according to the above embodiment and the aforementioned modifications are controlled by means of a control apparatus, not shown. The control apparatus controls the times of exposure periods, the timings at which pixel resetting signals and pixel charge transfer signals are applied, the first comparison timing, and the second comparison timing, etc., which are required for the solid-state image sensing devices 30 to operate as described above.

According to the present invention, when AD conversion is carried out, since an analog signal representative of the incident light energy $Q_{CA}$ or $Q_{CB}$, is subtracted from an analog signal representative of the incident light energy $Q_A$ or $Q_B$, there is no need to perform AD conversion on all of the analog signals. Therefore, with a reduced number of counter circuits, it is possible to produce digital values representative of the incident light energy $Q_A$ minus (−) the incident light energy $Q_{CA}$, and the incident light energy $Q_B$, minus (−) the incident light energy $Q_{CB}$. More specifically, inasmuch as differences between the amounts of photoelectrons in different photoelectron storage units, i.e. between a photoelectron storage unit that stores an amount of photoelectron ($Q_A$) generated by photoelectric conversion during a second period in which light is detected for a predetermined time after illuminating light has stopped illuminating the subject (e.g., a photoelectron storage unit of the second pixel 10c), and a photoelectron storage unit that stores an amount of photoelectron ($Q_{CA}$) generated by photoelectric conversion during a first period in which light is detected for a predetermined time while the subject is not illuminated with illuminating light (e.g., a photoelectron storage unit of the first pixel 10a), can be calculated upon AD conversion (this also holds true for the second pixel 10d and the first pixel 10b), the number of counter circuits can be reduced, the amount of consumed electric power can be reduced, and noise can be reduced. The above calculation also is effective to eliminate ambient light (background light). Using the values obtained according to the above processing operations, the energy of reflected light from the subject illuminated with illuminating light, and hence the distance to the subject, can be determined.

Although an embodiment of the present invention has been described above, the technical scope of the present invention is not limited to that of the above embodiment. It is obvious to those skilled in the art that various changes or improvements can be made to the above embodiment. It is apparent from the scope of the patent claims that such changes and modifications can also be included within the technical scope of the present invention.

The invention claimed is:

1. A solid-state image sensing device comprising:
   a first photoelectron storage unit for storing a photoelectron that is generated by photoelectric conversion during a first exposure period in which only ambient light is detected for a predetermined time while a subject is not illuminated with an emitted light by an illuminating unit for illuminating the subject for measuring a distance to the subject;
   a second photoelectron storage unit for storing a photoelectron that is generated by photoelectric conversion during a second exposure period for the predetermined time, including a period during which the emitted light reflected from the subject and the ambient light are detected; and an AD converter for converting an analog signal into a digital signal, wherein the AD converter includes:

a first comparator for comparing a reference voltage supplied from a reference voltage generator for generating the reference voltage, the level of which gradually varies, and a first analog signal from the first photoelectron storage unit with each other, and outputting a signal depending on the first analog signal;

a second comparator for comparing the reference voltage supplied from the reference voltage generator and a second analog signal from the second photoelectron storage unit with each other, and outputting a signal depending on the second analog signal;

a differential circuit for determining a difference between the signal depending on the first analog signal and the signal depending on the second analog signal, and outputting a differential signal representing the difference; and a first counter circuit for counting pulses of a pulse train depending on the differential signal, and converting the differential signal into a digital signal.

2. The solid-state image sensing device according to claim 1, wherein the differential circuit comprises an exclusive-OR circuit.

3. The solid-state image sensing device according to claim 1, wherein the differential circuit comprises a phase difference detector.

4. The solid-state image sensing device according to claim 1, wherein the first analog signal and the second analog signal comprise an analog signal of a black level and an analog signal of a signal level;

the first counter circuit comprises:

a plurality of flip-flop circuits for counting the pulses of the pulse train depending on the signal output from the differential circuit;

a plurality of switch circuits connected to respective previous stages of the flip-flop circuits, for selecting a propagated signal, or a low-level signal, or a high-level signal, which is input thereto, and outputting the selected signal as an output signal to each clock terminal of the following flip-flop circuits;

a control signal generating circuit for generating a switch circuit control signal for controlling the switch circuits to select the propagated signal, or the low-level signal, or the high-level signal; and a pulse generating circuit for generating one pulse for converting a count value into a 2's complement;

wherein the pulse train depending on the signal output from the differential circuit is supplied to a head one of the switch circuits as the propagated signal, and inverted output signals from the previous flip-flop circuits are supplied to switch circuits other than the head switch circuit, as the propagated signal;

the control signal generating circuit controls the switch circuits to output the propagated signal during a first AD conversion period in which the differential signal of the black level is converted into a digital signal, and during a second AD conversion period in which the differential signal of the signal level is converted into a digital signal, for thereby causing the flip-flop circuits to count up the pulses of the pulse train depending on the differential signal;

the control signal generating circuit controls the switch circuits to output the low-level signal and the high-level signal during a period in which the first AD conversion period is transferred to the second AD conversion period, for thereby converting the count value produced during the first AD conversion period into a 1's complement; and the pulse generating circuit inputs the generated one pulse to the head one of the switch circuits after the count value has been converted into the 1's complement and before the second AD conversion period, for thereby converting the count value produced during the first AD conversion period into the 2's complement.

5. The solid-state image sensing device according to claim 4, wherein each of the switch circuits includes a first transfer gate and a second transfer gate;

the switch circuit control signal includes a first control signal, which is input to the first transfer gate, for converting the count value into the 1's complement, and a second control signal for turning on and off the first transfer gate and the second transfer gate; and the propagated signal is input to the second transfer gate.

6. The solid-state image sensing device according to claim 1, wherein:

the first comparator compares the reference voltage and the first analog signal from the first photoelectron storage unit with each other, and inverts a signal output therefrom based on a comparison result thereof;

the second comparator compares the reference voltage and the second analog signal from the second photoelectron storage unit with each other, and inverts a signal output therefrom based on a comparison result thereof; and the second comparator inverts the signal output therefrom at a timing, which is later than a timing at which the first comparator inverts the signal output therefrom.

7. The solid-state image sensing device according to claim 6, wherein:

the reference voltage has a first reference level for auto-zeroing the first comparator and a second reference level for auto-zeroing the second comparator, the second reference level being different from the first reference level;

the first comparator is auto-zeroed such that a level produced by subtracting a first offset voltage from the first reference level and a level produced by subtracting a second offset voltage from an analog signal of a black level of the first analog signal are of the same potential; and the second comparator is auto-zeroed such that a level produced by subtracting a third offset voltage from the second reference level and a level produced by subtracting a fourth offset voltage from an analog signal of a black level of the second analog signal are of the same potential.

8. The solid-state image sensing device according to claim 1, wherein:

the first analog signal and the second analog signal comprise an analog signal of a black level and an analog signal of a signal level;

the first counter circuit comprises:

a plurality of flip-flop circuits for counting the pulses of the pulse train depending on the signal output from the differential circuit;

a plurality of switch circuits connected to respective previous stages of the flip-flop circuits, for selecting a propagated signal, or a low-level signal, or a high-level signal, which is input thereto, and outputting the selected signal as an output signal to each clock terminal of the following flip-flop circuits;

a control signal generating circuit for generating a switch circuit control signal for controlling the switch circuits to select the propagated signal, or the low-level signal, or the high-level signal; and
a pulse generating circuit for generating one pulse for converting a count value into a 2's complement,
wherein the pulse train depending on the signal output from the differential circuit is supplied to a head one of the switch circuits as the propagated signal, and inverted output signals from the previous flip-flop circuits are supplied to switch circuits other than the head switch circuit, as the propagated signal;
the AD converter comprises:
a third comparator for comparing the first analog signal and the second analog signal with each other;
a judging circuit for judging, based on a comparison result of the third comparator, whether or not the count value is to be converted into the 2's complement during a first complement conversion period transferring from a first AD conversion period, in which the differential signal of the black level is converted into a digital signal, to a second AD conversion period, in which the differential signal of the signal level is converted into a digital signal, and during a second complement conversion period after the second AD conversion period has finished; and
a complement control circuit for controlling the control signal generating circuit and the pulse generating circuit so as to control execution or non-execution of the process of converting the count value into the 2's complement, based on a judgment result of the judging circuit,
wherein the complement control circuit causes the control signal generating circuit to control the switch circuits to output the propagated signal, for thereby causing the flip-flop circuits to count up the pulses of the pulse train depending on the differential signal, and
wherein the complement control circuit causes the control signal generating circuit to control the switch circuits to output the low-level signal and the high-level signal during the complement conversion period in which it is judged that the count value is to be converted into the 2's complement, for thereby converting the count value into a 1's complement, and to control the switch circuits to output the propagated signal and control the pulse generating circuit in order to generate and input the one pulse to the head one of the switch circuits after the count value has been converted into the 1's complement.

9. The solid-state image sensing device according to claim 8, wherein the judging circuit:
judges that the count value is to be converted into the 2's complement during the first complement conversion period and that the count value is not to be converted into the 2's complement during the second complement conversion period, if the first analog signal of the black level is greater than the second analog signal of the black level and the first analog signal of the signal level is greater than the second analog signal of the signal level;
judges that the count value is not to be converted into the 2's complement during the first complement conversion period and the second complement conversion period, if the first analog signal of the black level is smaller than the second analog signal of the black level and the first analog signal of the signal level is greater than the second analog signal of the signal level;
judges that the count value is to be converted into the 2's complement during the second complement conversion period and that the count value is not to be converted into the 2's complement during the first complement conversion period, if the first analog signal of the black level is greater than the second analog signal of the black level and the first analog signal of the signal level is smaller than the second analog signal of the signal level; and
judges that the count value is to be converted into the 2's complement during the first complement conversion period and the second complement conversion period, if the first analog signal of the black level is smaller than the second analog signal of the black level and the first analog signal of the signal level is smaller than the second analog signal of the signal level.

10. The solid-state image sensing device according to claim 1, wherein the first photoelectron storage unit and the second photoelectron storage unit are disposed in different unit pixels.

11. The solid-state image sensing device according to claim 1, wherein the first photoelectron storage unit and the second photoelectron storage unit are disposed in one unit pixel.

12. The solid-state image sensing device according to claim 1, wherein the AD converter further includes a second counter circuit for counting pulses of a pulse train depending on the signal output from the first comparator, and converting the signal into a digital signal.

* * * * *